(12) United States Patent
Kitani et al.

(10) Patent No.: US 6,461,946 B2
(45) Date of Patent: Oct. 8, 2002

(54) METHOD OF MANUFACTURING SEMICONDUCTOR DEVICE

(75) Inventors: Takeshi Kitani; Katsumi Eikyu; Masao Sugiyama, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/843,859

(22) Filed: Apr. 30, 2001

(65) Prior Publication Data

US 2001/0036714 A1 Nov. 1, 2001

(30) Foreign Application Priority Data

May 1, 2000 (JP) ........................... 2000-132411
Feb. 13, 2001 (JP) ........................... 2001-035127

(51) Int. Cl.[7] ............................................. H01L 21/04
(52) U.S. Cl. .................. 438/510; 438/514; 438/522; 438/527
(58) Field of Search ............................. 438/527, 510, 438/514, 223, 525

(56) References Cited

U.S. PATENT DOCUMENTS 6,054,344 A * 4/2000 Liang et al. ................ 438/223
6,228,726 B1 * 5/2001 Liaw ........................... 438/294
6,297,102 B1 * 10/2001 You et al. .................... 438/275

FOREIGN PATENT DOCUMENTS

| JP | 55-154770 | 12/1980 |
| JP | 58-131748 | 8/1983 |
| JP | 4-68564 | 3/1992 |
| JP | 7-147327 | 6/1995 |
| JP | 7-273184 | 10/1995 |

* cited by examiner

*Primary Examiner*—David Nelms
*Assistant Examiner*—Thao P Le
(74) *Attorney, Agent, or Firm*—Oblon, Spivak, McClelland, Maier & Neustadt, P.C.

(57) ABSTRACT

Both P type and N type impurities are implanted from a plurality of directions. The tilt angle $\theta$ of the implantation direction against the normal of the main surface of a semiconductor substrate is fixed to 10°, and the deflection angle $\phi$ is set to such four directions (X, X+90°, X+180°, and X+270°, where X is an arbitrary angle) that projecting components of a vector indicating the implantation direction are opposed to each other on two lines that cross each other at right angles along the main surface of the semiconductor substrate. Thereby, the dependency of the breakdown voltage of element isolation on the direction of a well boundary is suppressed to realize a high breakdown voltage of element isolation in all directions.

12 Claims, 26 Drawing Sheets

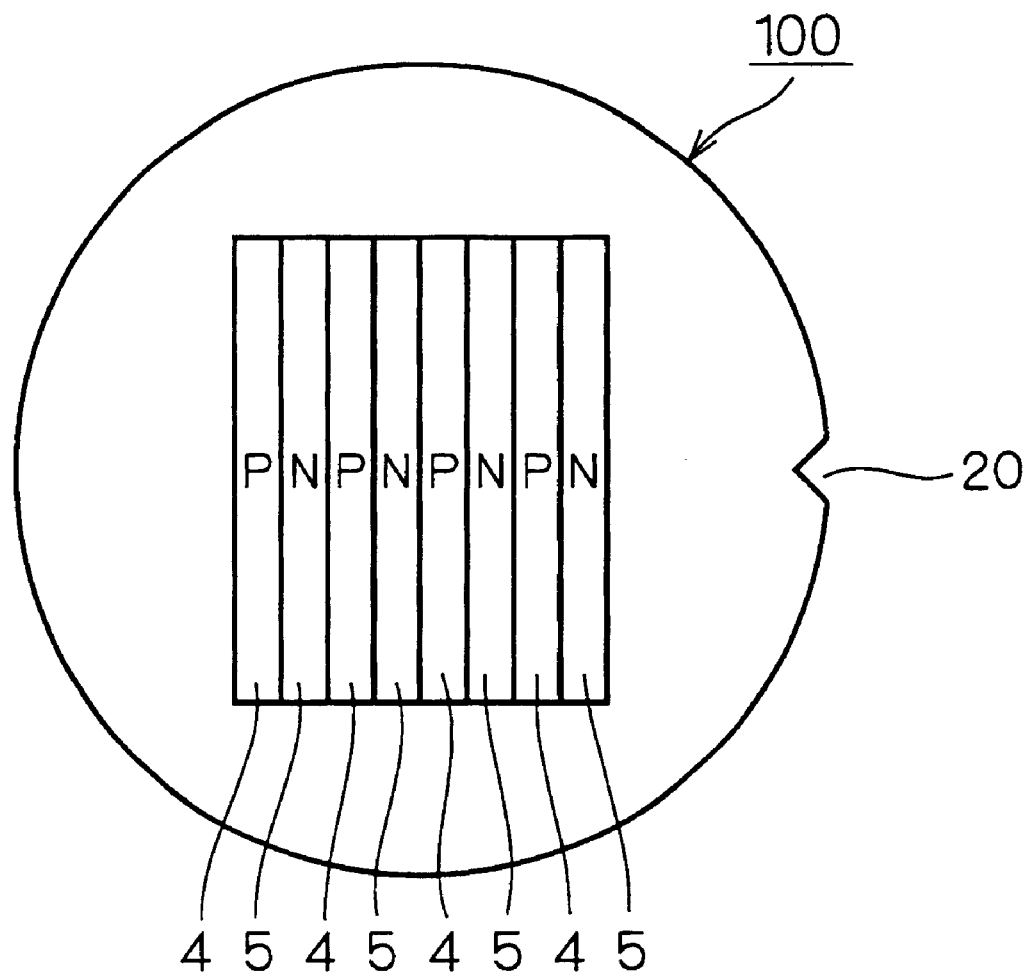
F I G . 1

FIG. 5
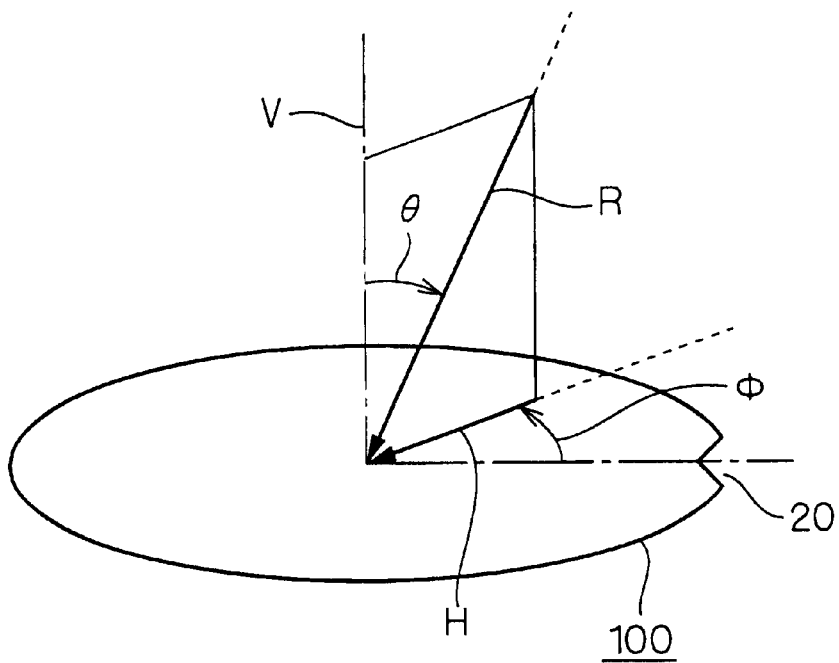
FIG. 6 (BACKGOUND ART)
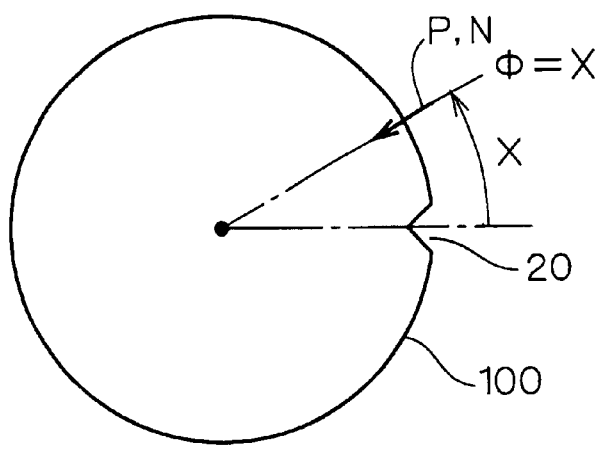
$\begin{cases} \theta = 10° \\ X = 0 \sim 360° \end{cases}$ FIG. 7 (BACKGOUND ART)
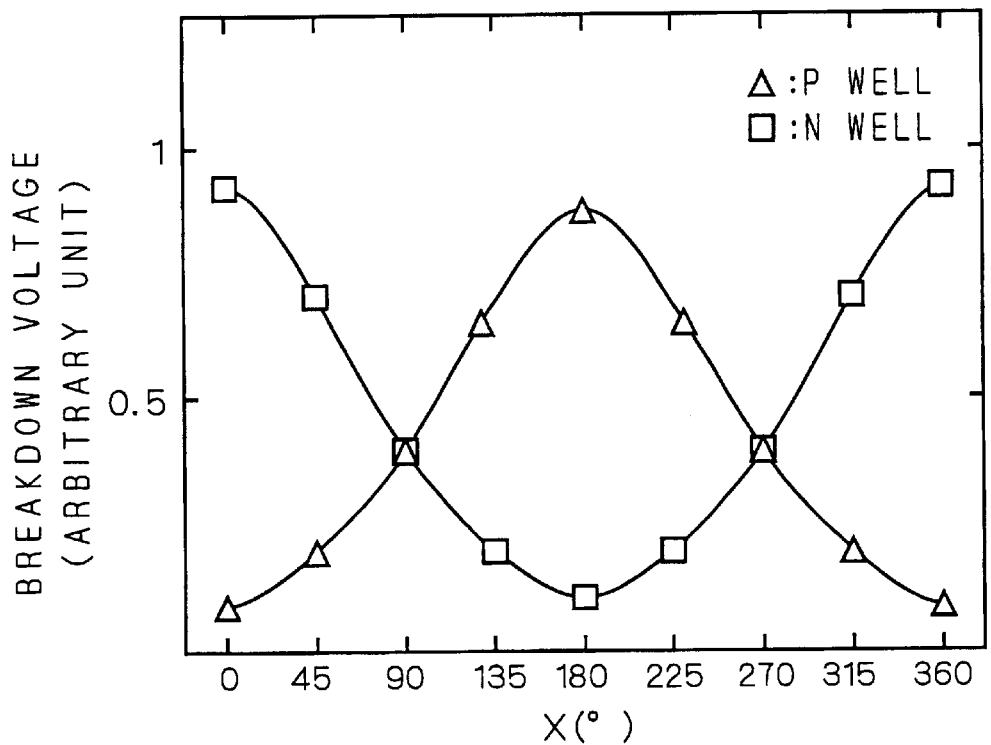
FIG. 8
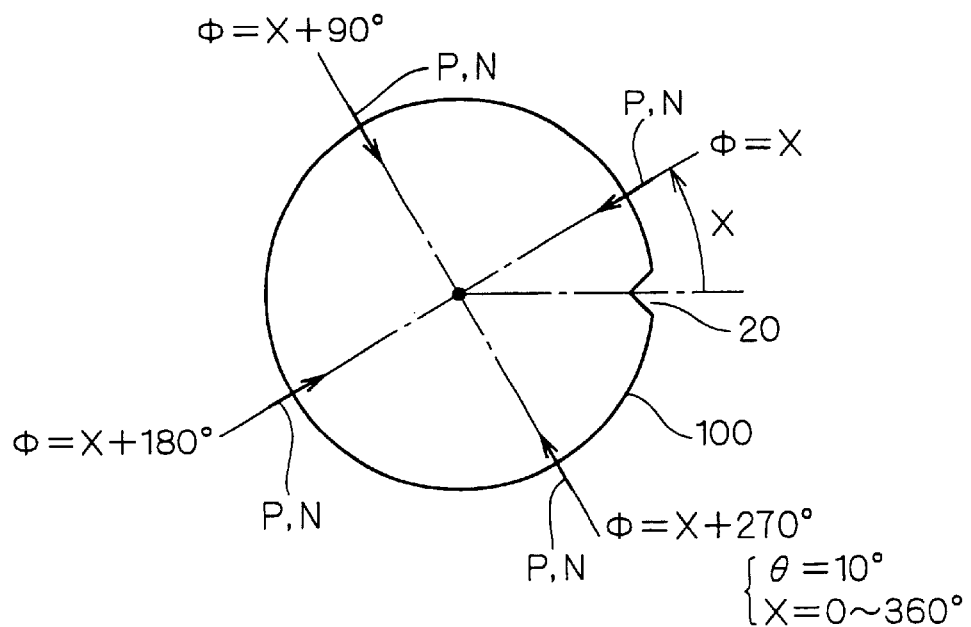

F I G. 25
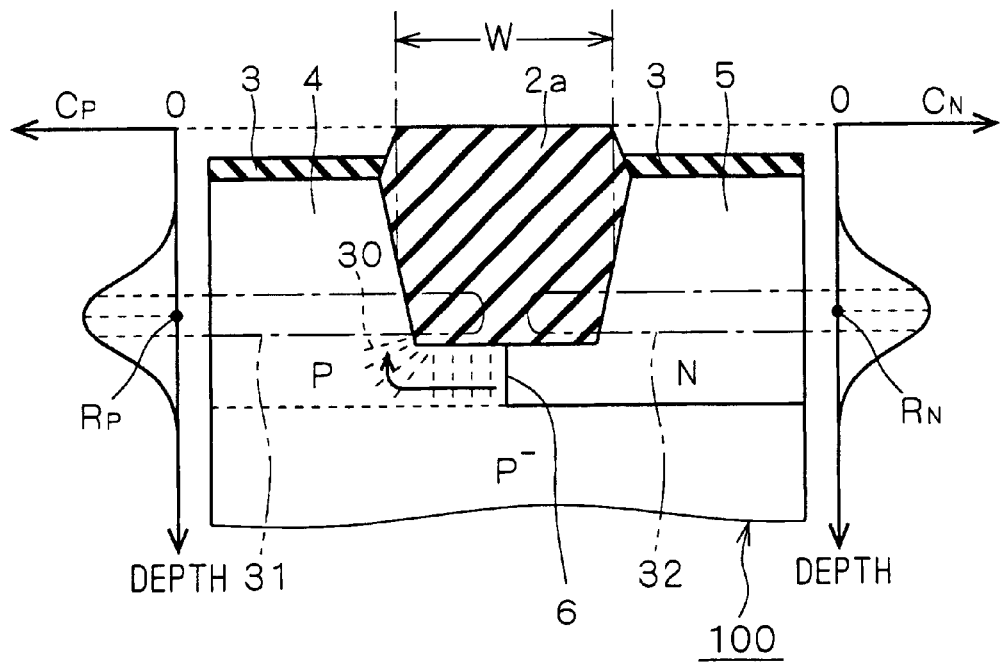
F I G. 26
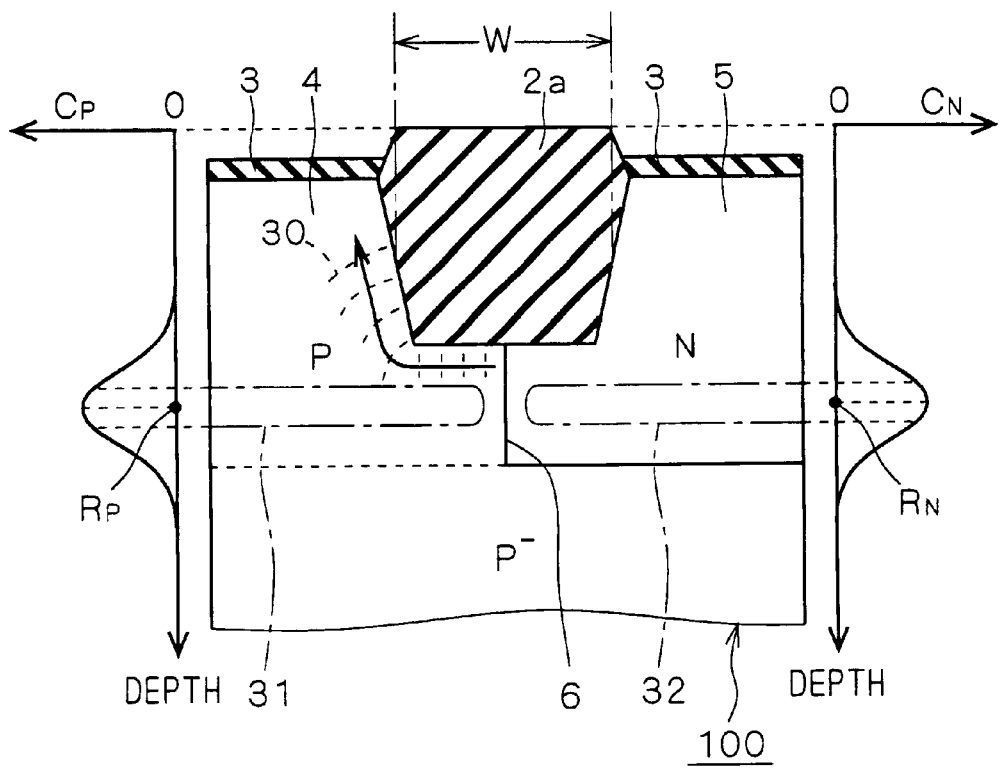

$\begin{cases} \theta=10° \\ X=0\sim180° \end{cases}$

METHOD OF MANUFACTURING SEMICONDUCTOR DEVICE

BACKGROUND OF THE INVENTION

1. Field of the Invention

The present invention relates to a method of manufacturing a semiconductor device suitable for manufacturing memory devices and information processing units. More particularly, the invention is concerned with improvements in increasing the breakdown voltage of element isolation, irrespective of the direction of a well boundary.

2. Description of the Background Art

FIG. 39 is a plan view schematically illustrating a main surface of a semiconductor substrate of a semiconductor device before semiconductor elements are formed thereon, the substrate having on its surface wells for element isolation. In the main surface of the semiconductor substrate 100, a STI (Shallow Trench Isolation) 2 as an element isolation structure is selectively formed, and a plurality of element regions 1 are separated from one another, by the STI 2. The pattern shape of the STI 2 is variously set depending on the application of the semiconductor device. The pattern shape shown in FIG. 39 is a simple model that is supposed for convenience of explanation.

FIG. 40 is a sectional view taken along the line A—A of FIG. 39. A P well 4 or an N well 5 is disposed in each element region 1, and a boundary (called "well boundary") 6 between the wells 4 and 5 having different conductivity types is disposed directly below the STI 2. The main surface of the semiconductor substrate 100 is covered with an insulating film 3, together with the STI 2. After forming the P well 4 and N well 5, semiconductor devices, e.g., MOSFETs, are formed thereon, which are not shown in FIG. 40. Thereby, the semiconductor elements are isolated from each other, by the STI 2 and the well boundary 6 directly therebelow. That is, the P well 4 and N well 5 are aimed at element isolation.

FIGS. 41 and 42 are diagrams of the steps of forming a P well 4 and an N well 5. Referring to FIG. 41, a resist 8, which is patterned such that an opening is selectively provided in a region where a P well 4 should be formed, is disposed on a main surface of a semiconductor substrate 100. By using the resist 8 as a shield, a P type impurity ion 14 is implanted to selectively form the P well 4. In order to avoid channeling derived from the crystal structure of the semiconductor substrate 100, the impurity implantation is performed with the implantation direction tilted from about 3 to about 15° from the normal of the main surface. Implantation energy is set to a range from 100 to 500 keV, for example. The resist 8 is then removed when the implantation is completed.

Referring to FIG. 42, a resist 9, which is patterned such that an opening is selectively provided in a region where an N well 5 should be formed, is disposed on the main surface of the semiconductor substrate 100. By using the resist 9 as a shield, an N type impurity ion 15 is implanted to selectively form the N well 5. Implantation direction and energy is the same as in the step of FIG. 41. The resist 9 is then removed when the implantation is completed.

Through the foregoing steps, there is obtained the structure of FIG. 40 before semiconductor elements are disposed thereon. The same structure can be obtained even if the order of the steps of FIGS. 41 and 42 is reversed.

However, since the impurity ion is implanted in a direction tilted with respect to the normal of a wafer, the following problem will arise depending on the relationship between the implantation direction and the direction of well boundary 6. Specifically, the structure of FIG. 43 that departs from the ideal form of FIG. 40, might be made due to the shadowing effect of preventing implantation toward the shadow portion of the resist 8, as shown in FIG. 41, or the effect of unnecessary implantation up to the direct underside of the resist 9, as shown in FIG. 42. In the structure of FIG. 43, the well boundary 6 is deviated distance D from the desired position.

It is known that the deviation of the well boundary 6 degrades the element isolation capability of wells, namely, the breakdown voltage of element isolation. It is also known that this degradation is more remarkable with decreasing widths W1 and W2 of the STI 2 (called "isolation width") shown in FIG. 39. It is however the modem trend that the isolation width is being made narrower as the high integration of semiconductor devices is advanced.

Referring again to FIG. 39, it is possible to select the ion implantation direction so as not to cause any deviation of the well boundary 6. along the STI 2 extending in a single direction (e.g., side to side on FIG. 25). In this case, however, the well boundary 6 along the STI 2 extending in another direction (e.g., up and down on FIG. 25) suffers from a noticeable deviation. For preventing this, if the isolation width W2 is made wider than the isolation width W1, the high integration of semiconductor devices is hindered. This can also be one factor in hindering the degree of freedom of layout.

Thus, it has conventionally been impossible to increase the breakdown voltage of element isolation by eliminating the deviations of all the well boundaries 6, without depending on their directions, at the same time that the isolation width is uniformly set to a small value, in order to ensure both the high integration of a semiconductor device and the degree of freedom of layout design.

SUMMARY OF THE INVENTION

According to a first aspect of the invention, a method of manufacturing a semiconductor device comprises the steps of: (a) preparing a semiconductor substrate having a main surface; (b) with M (M≧2) implantation types defined by combination of an impurity element and its implantation energy, performing an impurity implantation to the main surface through a plurality of shields disposed on the main surface, thereby to selectively form a P well and an N well adjacent each other in the main surface, and, for N (1≦N≦M) types of the M implantation types, performing the implantation from a plurality of directions such that projecting components of a vector indicating an implantation direction toward the main surface are cancelled with each other; and (c) forming a semiconductor element in each of the P well and the N well.

According to a second aspect, the method of the first aspect is characterized in that in the step (b), for each of the N implantation types, the implantation is performed from the plurality of directions such that the projecting components are cancelled with each other.

According to a third aspect, the method of the second aspect is characterized in that in the step (b), the N equals the M.

According to a fourth aspect, the method of the first aspect is characterized in that in the step (b), the N is 2 or more, and the implantation is performed from the plurality of directions such that the projecting components are cancelled with each other, between different implantation types.

According to a fifth aspect, the method of the fourth aspect is characterized in that in the step (b), the N equals the M, the conductivity type of the impurity element differs between the different implantation types, and the implantation is performed from the plurality of directions such that the projecting components are cancelled with each other, between all implantation types of N type impurity and all implantation types of P type impurity.

According to a sixth aspect, the method according to any of the first to fifth aspects is characterized in that in the step (b), the plurality of directions are two directions selected such that the projecting components are opposed to each other on a line along the main surface.

According to a seventh aspect, the method according to any of the first to fifth aspects is characterized in that in the step (b), the plurality of directions are four directions selected such that the projecting components are opposed to each other on two lines that cross each other at right angles along the main surface.

According to an eighth aspect, the method according to any of the first to fifth aspects is characterized in that in the step (b), the plurality of directions is a continuously infinite direction in which the projecting components are continuous in all directions of 360°.

According to a ninth aspect, the method of the first aspect further comprises the step (d) of selectively forming an element isolation structure in the main surface of the semiconductor substrate, wherein in the step (b), the P well and the N well are formed such that the element isolation structure is located at the boundary between the P well and the N well, and the implantation is performed for at least one of the M implantation types so as to have a range less than the thickness of the element isolation structure.

According to a tenth aspect, the method of the ninth aspect is characterized in that in the step (b), the implantation is performed for all of the M implantation types so as to have a range less than the thickness of the element isolation structure.

According to an eleventh aspect, a method of manufacturing a semiconductor device comprises the steps of: (a) preparing a semiconductor substrate having a main surface; (b) selectively forming an element isolation structure in the main surface of the semiconductor substrate; (c) with M (M≦2) implantation types defined by combination of an impurity element and its implantation energy, performing an impurity implantation to the main surface through a plurality of shields disposed on the main surface, thereby to selectively form a P well and an N well adjacent each other in the main surface so that the element isolation structure is located at the boundary between the P well and the N well, and, performing the implantation for at least one of the M implantation types so as to have a range less than the thickness of the element isolation structure; and (d) forming a semiconductor element in each of the P well and the N well.

According to a twelfth aspect, the method of the eleventh aspect is characterized in that in the step (c), the implantation is performed for all of the M implantation types so as to have a range less than the thickness of the element isolation structure.

In the first aspect, the uniformity of breakdown voltage of element isolation to the direction of the well boundary is improved and a high breakdown voltage of element isolation is realized in all directions because, for a single or a plurality of implantation types, the implantation is performed from a plurality of directions such that the projecting components of the vector indicating the implantation direction toward the main surface of the semiconductor substrate are cancelled with each other.

In the second aspect, the uniformity of breakdown voltage of element isolation to the direction of the well boundary is more improved because, for each of some implantation types, the implantation is performed from a plurality of directions such that the projecting components are cancelled with each other.

In the third aspect, the uniformity of breakdown voltage of element isolation to the direction of the well boundary is furthermore improved because, for all the implantation types, the implantation is performed from a plurality of directions such that the projecting components are cancelled with each other.

In the fourth aspect, the implantation can be performed efficiently with lesser number of steps, because the implantation is performed from a plurality of directions such that the projecting components are cancelled with each other, between different implantation types.

In the fifth aspect, the uniformity of breakdown voltage of element isolation to the direction of the well boundary is more improved because the implantation is performed from a plurality of directions such that the projecting components are cancelled with each other, between all the implantation types of N type impurity and all the implantation types of P type impurity.

In the sixth aspect, the implantation can be performed efficiently with lesser number of steps, because a plurality of implantation directions is two directions selected such that the projecting components are opposed to each other on a line along the main surface of the semiconductor substrate.

In the seventh aspect, the uniformity of breakdown voltage of element isolation to the direction of the well boundary is furthermore improved because a plurality of implantation directions is four directions selected such that the projecting components are opposed to each other on two lines that cross each other at right angles along the main surface of the semiconductor substrate.

In the eighth aspect, the uniformity of breakdown voltage of element isolation to the direction of the well boundary is furthermore improved because a continuously infinite direction in which the projecting component is continuous in all directions of 360°, is set as a plurality of implantation directions.

In the ninth aspect, the breakdown voltage of element isolation is further improved because the implantation of at least one implantation type is performed so as to have a range less than the thickness of the element isolation structure.

In the tenth aspect, the breakdown voltage of element isolation is furthermore improved because the implantation of every implantation type is performed so as to have a range less than the thickness of the element isolation structure.

In the eleventh aspect, the breakdown voltage of element isolation is improved because the implantation of at least one implantation type is performed so as to have a range less than the thickness of the element isolation structure.

In the twelfth aspect, the breakdown voltage of element isolation is further improved because the implantation of every implantation type is performed so as to have a range less than the thickness of the element isolation structure.

It is an object of the present invention to provide a method of manufacturing a semiconductor device with which the dependency of the breakdown voltage of element isolation on the well boundary direction is suppressed to realize a high breakdown voltage of element isolation in all directions.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a semiconductor device used in verifying the method of each preferred embodiment of the invention;

FIG. 5 is a diagram illustrating an implantation method for verifying the method of each preferred embodiment;

FIG. 6 is a diagram illustrating a conventional implantation method to be compared with each preferred embodiment;

FIG. 7 is a graph showing the results of measurement made for the conventional method;

FIG. 8 is a diagram illustrating an implantation method according to a first preferred embodiment;

FIG. 25 is a diagram illustrating a method according to an eighth preferred embodiment;

FIG. 26 is a diagram showing a method to be compared with the method of the eighth preferred embodiment;

DESCRIPTION OF THE PREFERRED EMBODIMENTS

1. Outline of Preferred Embodiments

Figure 2:
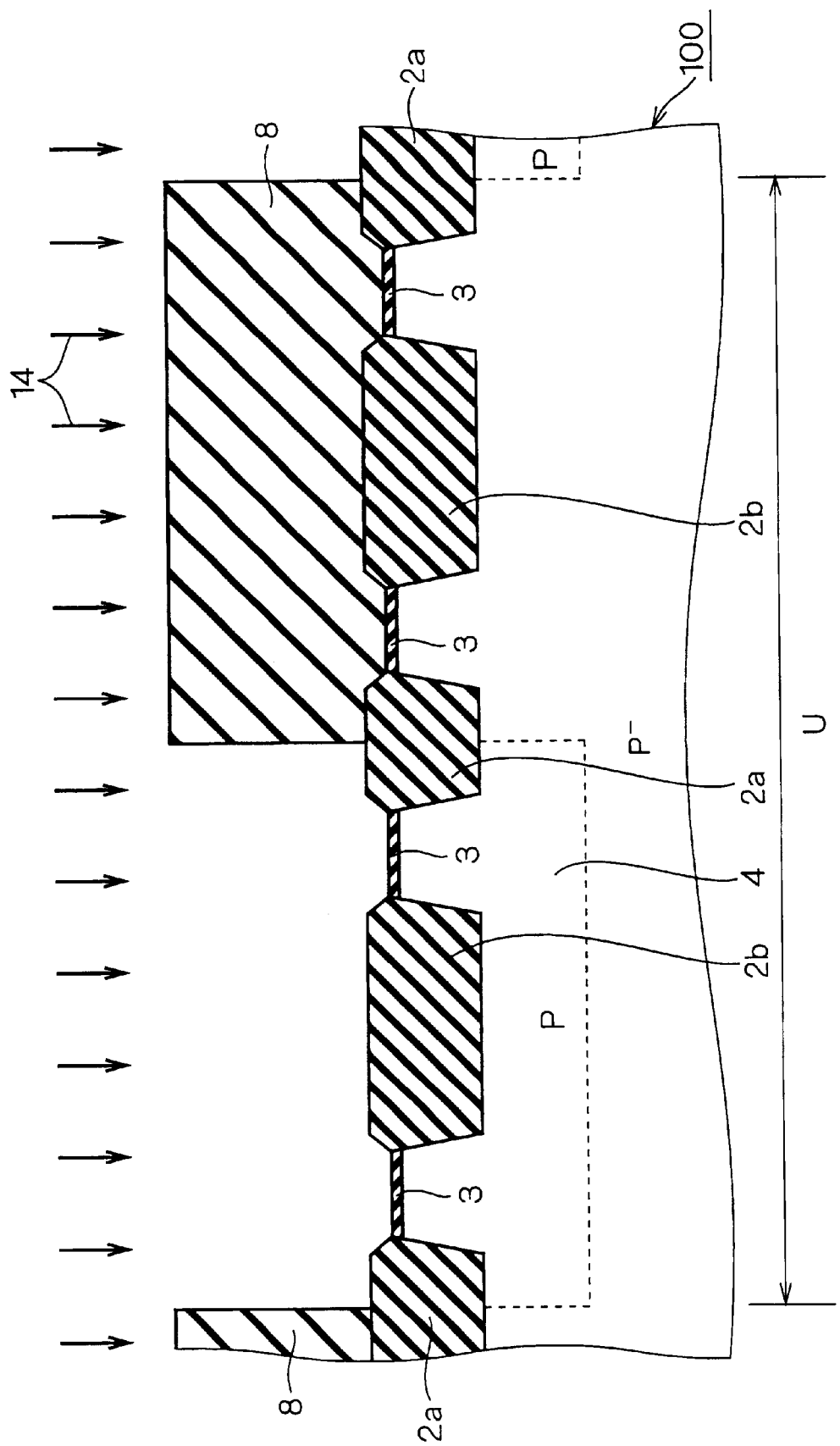
FIGS. 2 and 3 are diagrams of the steps of manufacturing a semiconductor device which are used in verifying the method of each preferred embodiment.

In order that the dependency of the breakdown voltage of element isolation on the well boundary direction is suppressed for uniformly increasing the breakdown voltage of element isolation, in the following preferred embodiments the direction of impurity implantation for forming wells is set to a plurality of directions, not a single direction. Simulation is employed to evaluate the characteristic of the wells formed by each method of the preferred embodiments.

FIG. 1 is a plan view of a semiconductor substrate illustrating the layout shape of wells to be simulated. In FIG. 1 and other following figures, similar reference numerals will be used to denote the same parts or like parts (which have the same function) as the conventional device shown in FIGS. 25 to 29. Their detailed description is omitted.

P wells 4 and N wells 5, each extending in the form of a strip in a single direction, alternate with each other in a main surface of a semiconductor substrate 100 shown in FIG. 1. It is assumed that the P wells 4 and N wells 5 are disposed along a radial passing through a notch 20, and these extend in the form of a strip in the direction orthogonal to the radial. The layout shape of FIG. 1 is one which is selected, for convenience, so as to be suitable for the characteristic evaluation of the wells. All the methods of the preferred embodiments are applicable to any layout shape.

Figure 3:
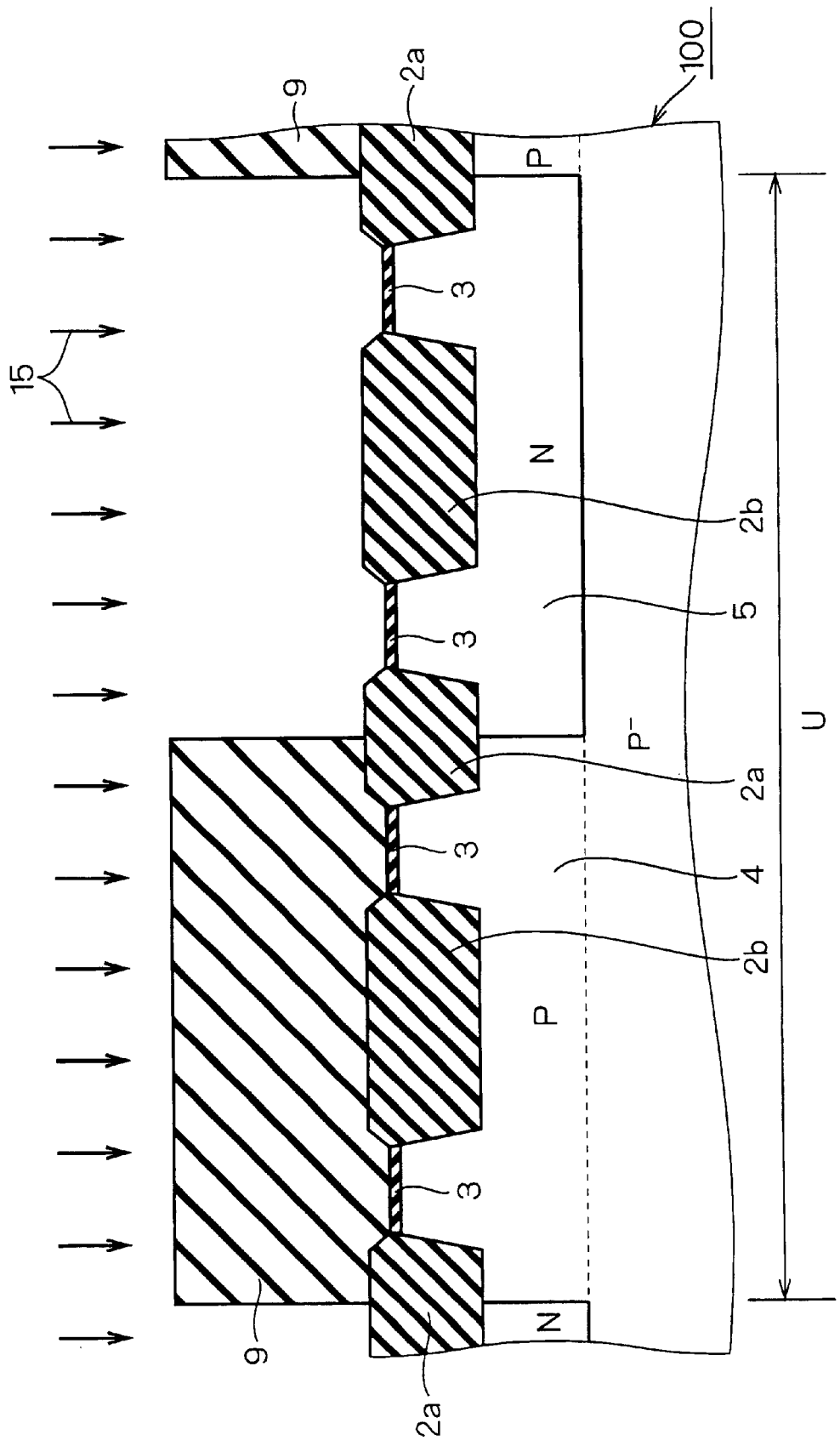

FIGS. 2 and 3 are diagrams illustrating the steps of forming the P wells 4 and N wells 5 of FIG. 1 which are suitable for characteristic evaluation. Referring to these figures, the layout shape of FIG. 1 is obtained by repeatedly disposing a repetitive unit U from side to side on FIG. 1. Referring to FIG. 2, there is prepared a P type silicon substrate as a semiconductor substrate 100, and a STI 2 as an isolation structure is selectively formed in its main surface. An insulating film 3 is formed on the part of the main surface in which no STI 21 is disposed. The insulating film 3 is disposed as a thermal oxidation film, and functions as a protection film during ion implantation.

Subsequently, a resist 8, which is patterned such that an opening is selectively provided in the region where a P well 4 should be formed, is disposed on the main surface of the semiconductor substrate 100. The patterning of the resist 8 is conducted by means such as a known lithography method. By using the resist 8 as a shield, a P type impurity ion 14 is implanted to selectively form the P well 4. For convenience of the characteristic evaluation, it is assumed that a narrow STI 2a and a wide STI 2b coexist as a STI 2. The resist 8 is then removed when the implantation is completed.

Referring to FIG. 3, a resist 9, which is patterned such that an opening is selectively provided in the region where an N well 5 should be formed, is disposed on the main surface of the semiconductor substrate 100. By using the resist 9 as a shield, an N type impurity ion 15 is implanted to selectively form the N well 5. The resist 9 is then removed when the implantation is completed. The order of the steps of forming the P well 4 and N well 5 may be reversed.

Figure 4:
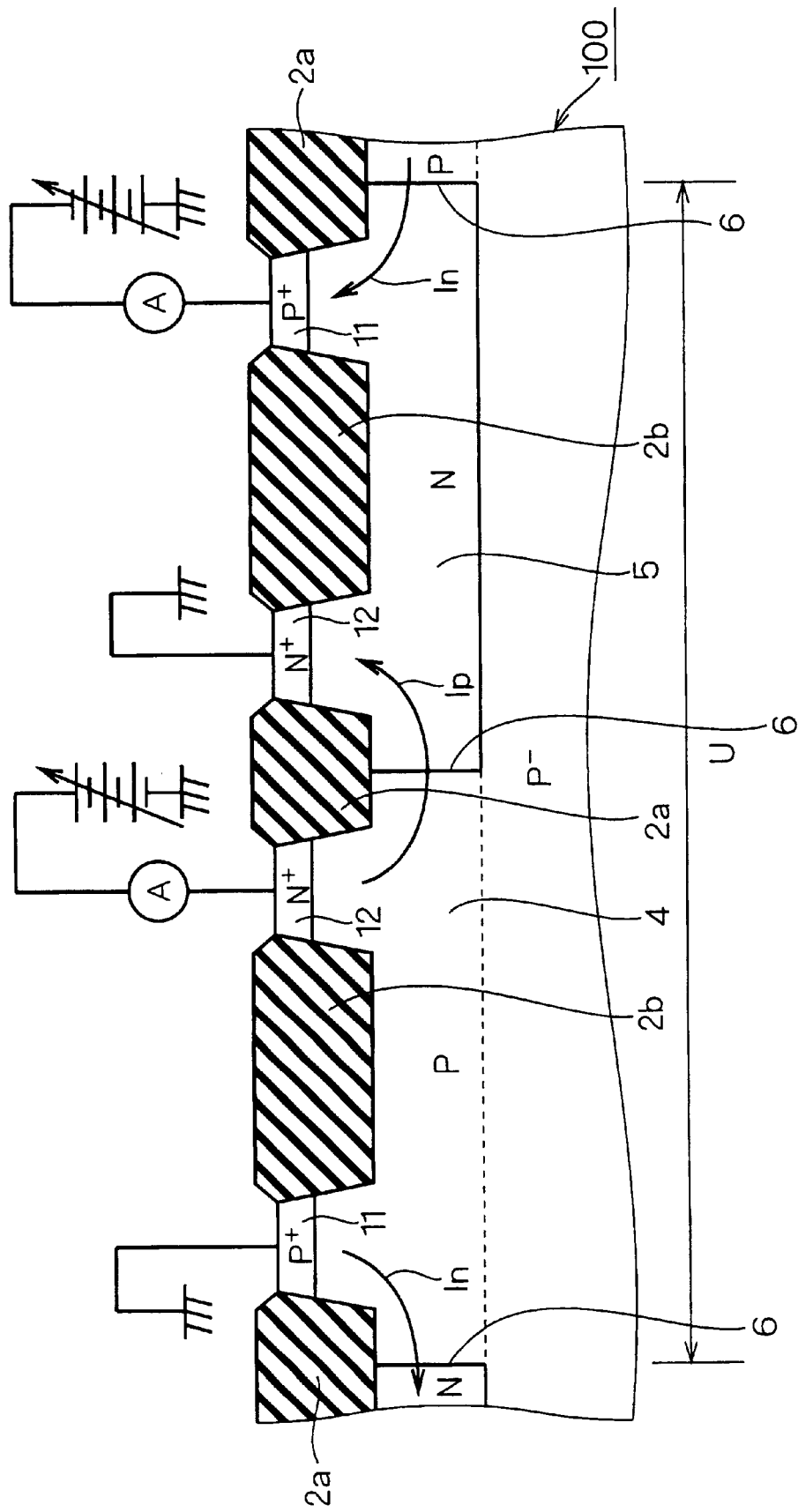
FIG. 4 is a diagram illustrating a measuring method for verifying the method of each preferred embodiment.

FIG. 4 is a diagram illustrating one step in a method of measuring the breakdown voltage of element isolation of the P well 4 and N well 5 thus formed. As shown in FIG. 4, in the structure to be measured, a $P^+$ layer 11 and an $N^+$ layer 12 are selectively formed on the upper surface of both the P well 4 and N well 5. The P+ layer 11 and $N^+$ layer 12 are modeling of the source/drain regions of a MOSFET which will be formed as semiconductor elements, after the steps of FIGS. 2 and 3. If the $P^+$ layer 11 and $N^+$ layer 12 are divided so as to sandwich a channel region, they result in the same structure as the source/drain regions.

Referring to FIG. 4, a ground potential (zero potential) and a positive potential are applied to the P well 4 through the $P^+$ layer 11 and $N^+$ layer 12, respectively. A ground potential and a negative potential are applied to the N well 5 through the $N^+$ layer 12 and $P^+$ layer 11, respectively. In this state, leakage currents Ip and In that flow the well boundary 6 are measured. The leakage current Ip is the leakage current that flows from the $N^+$ layer 12 of the well 4 to the $N^+$ layer 12 of the well 5, and the leakage current In is the leakage current that flows from the $P^+$ layer 11 of the well 4 to the $P^+$ layer 11 of the well 5.

Measurement of the leakage currents is made by changing an applied voltage in the range of 0 V to ±15 V. The applied voltage at which the leakage current reaches a reference current value is evaluated as a breakdown voltage of element isolation. In simulation, ±1 fA/· is employed as a reference current value. It should be noted that only a second preferred embodiment employs a method shown in FIGS. 10 to 12 as will hereinafter be described, instead of that shown in FIGS. 2 to 4.

FIG. 5 is a diagram illustrating a method of expressing the direction of a characteristic impurity implantation in the preferred embodiments. In FIG. 5, vector R indicates an implantation direction, and it may be the velocity or momentum of the implanted ion. Alternatively, it may be the vector (so-called unit vector) that expresses only an implantation direction by letting length be 1. Component H indicates the projecting component of the vector R toward the main surface of the semiconductor substrate 100. A tilt angle θ of an implantation direction from the normal V of the main surface of the semiconductor substrate 100 corresponds to the polar angle of the vector R. The deflection angle φ of the projecting component H, when a certain radial on the main surface of the semiconductor substrate 100 is employed as reference, corresponds to the azimuth of the vector R. The direction that is used as a reference of the deflection angle φ, that is, the direction of φ=0, is set to a radial passing through the notch 20, for convenience.

In the steps of manufacturing a semiconductor device, for changing or setting the deflection angle φ, it is the easiest way to rotate the semiconductor substrate 100 around the normal V. It is also possible to change or set the implantation direction with the semiconductor substrate 100 fixed. The tilt angle θ and deflection angle φ mean a relative angle between the main surface of the semiconductor substrate 100 and the implantation direction.

2. Conventional Method to be Compared

In order to evaluate the methods of the following preferred embodiments, simulation is also made for a conventional method. A comparison of the characteristic with the wells formed by the conventional method will be made in the preferred embodiments.

In the simulation of the conventional method to be compared, the method shown in FIGS. 1 to 4 is employed like the preferred embodiments. In this case, the thickness of an insulating film 3 is set to 20 nm, the width of a STI 2a is set to 0.5 μm, and the thickness of the STIs 2a and 2b are set to 400 nm. The thickness and width of a resist 8 are set to 2.5 μm and 2.0 μm, respectively. The thickness and width of the resist 9 are set to 2.5 μm and 5.0 μm, respectively.

Impurity implantation for forming wells is simulated as follows. In a P type impurity implantation, boron is used as the impurity element, and a first implantation at an energy of 280 keV and a dose of $2×10^{13}$ atom/cm$^3$, and a second implantation at an energy of 160 keV and a dose of $1×10^{12}$ atom/cm$^3$, are performed in succession. In an N type impurity implantation, phosphorus is used as the impurity element, and the energy and dose are set to 400 keV and $1×10^{13}$ atom/cm$^3$, respectively.

In the present specification, the mode of the implantation defined by combination of an impurity element and an energy, is called "implantation type." Accordingly, three implantation types are used in the conventional method to be compared.

Referring to FIG. 6, a P type impurity and an N type impurity are implanted from the same direction. That is, the three implantation types are set to a single value common in the tilt angle θ and deflection angle φ. The tilt angle θ is set to 10°, and the deflection angle φ is set to an arbitrary angle X (i.e., φ=X), in order to check the dependency of the breakdown voltage of element isolation on the implantation direction. Various values in the range of 0 to 360° are set as the angle X. Samples corresponding to the number of the angle X are formed and measured on simulation.

FIG. 7 is a graph showing the results of measurement. FIG. 7 shows that as the deflection angle φ (=X) changes, the breakdown voltage of element isolation of the P well 4 and that of the N well 5 are inverted at the points of 90° and 270°. The fact that the deflection angle φ is 90° or 270° is equal to that the direction of the well boundary 6 (FIG. 4) and the projecting component H (FIG. 5) are parallel with each other. At this point, the deviation D of the well boundary 6 (see FIG. 29) is the minimum. Thus, in the conventional method the breakdown voltage of element isolation strongly depends on the implantation direction, because the deflection angle φ is set to a single value that is common to the P type impurity and N type impurity.

As illustrated as a model in FIG. 25, if the STI 2 and the well boundary 6 directly therebelow are formed such as to extend in only two directions in which these cross at right angles, the same breakdown voltage of element isolation for the well boundary 6 extending in the two directions can be obtained by selecting, as a deflection angle φ, one value given by the expression of φ=45°+n×90° (n is an integer). However, the breakdown voltage of element isolation thus obtained is a lower value of the two values given by the expression of φ=45°+n×90° in FIG. 7, and it is merely about half the is value given by expression of φ=90°+n×180° at which the deviation of the well boundary 6 is the minimum. Further, the degree of freedom in layout design is narrowed because the direction of the STI 2 is limited to two directions only.

The dependency of the breakdown voltage of element isolation on the angle X of 1 to 180° and that on the angle X of 180 to 360° is symmetrical with respect to a symmetry axis of X=180°. Therefore, only the results in the range of X=0 to 180° is illustrated in the graphs of the following preferred embodiments.

3. First Preferred Embodiment

According to a method of a first preferred embodiment, in the steps of FIGS. 2 to 4, the thickness of an insulating film 3 is set to 20 nm, the width of a STI 2a is set to 0.5 µm, and the thickness of the STIs 2a and 2b are set to 400 nm. The thickness and width of a resist 8 are set to 2.5 µm and 2.0 µm, respectively. The thickness and width of a resist 9 are set to 2.5 µm and 5.0 µm, respectively.

As to impurity implantation for forming wells, the impurity element, energy and dose are set to the same conditions as in the conventional method to be compared. That is, three implantation types are used in the impurity implantation.

Referring to FIG. 8, a P type impurity and an N type impurity are implanted from a plurality of directions. Specifically, for the three implantation types, the tilt angle θ is fixed to 10°, and the deflection angle φ is set to four directions: X, X+90°, X+180°, and X+270°. That is, all the implantation directions of the three implantation types are set to such four directions that projecting components H are opposed to each other on each of two lines that cross at right angles along the main surface.

Figure 9:
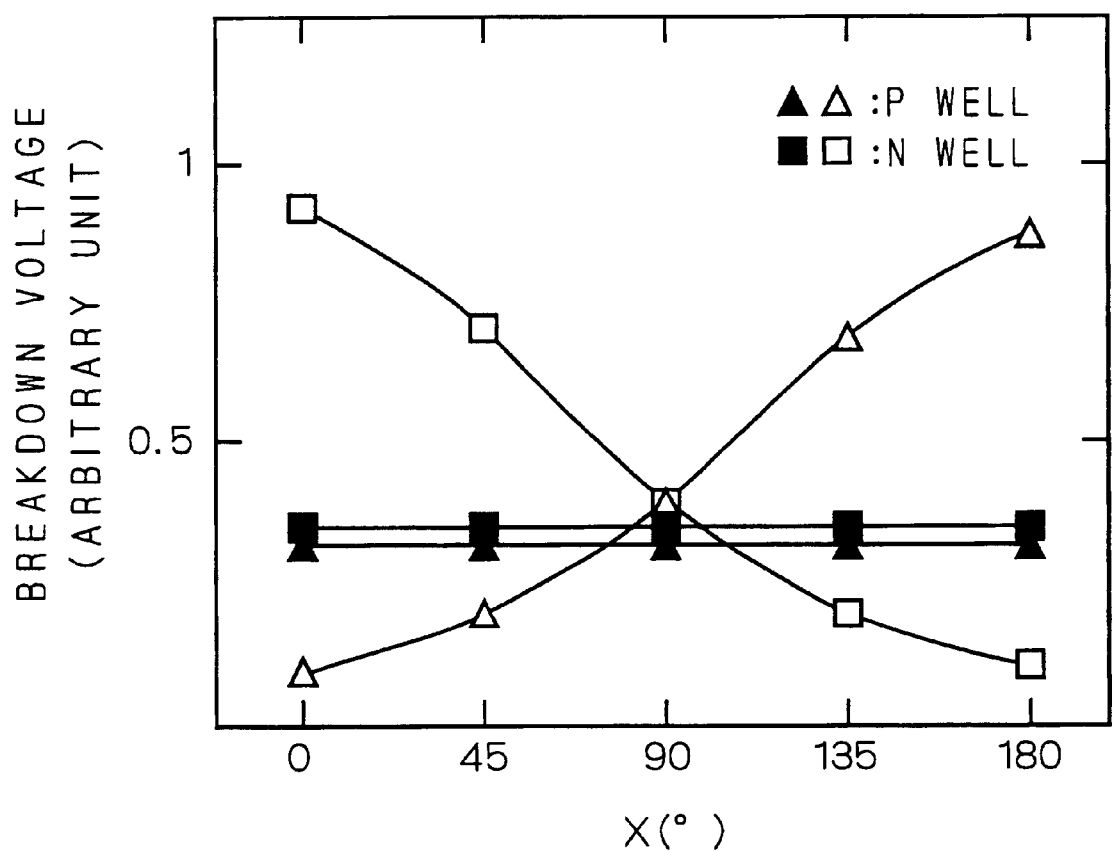
FIG. 9 is a graph showing the results of measurement made for the method of the first preferred embodiment.

FIG. 9 is a graph showing the results of measurement. In FIG. 9 and other following graphs, white marks represent the results of the conventional method to be compared, and black marks represent the results of the method of the corresponding preferred embodiment. As shown in FIG. 9, even when angle X changes, the breakdown voltages of element isolation in the P well 4 and N well 5 hardly change, and there are no noticeable differences between the P well 4 and N well 5. Their breakdown voltage of element isolation are close to the value at X=90°+n×180° in the results of the conventional method, and also greater than the lower value of the two values at X=45°+n×90°.

The results of FIG. 9 indicates that irrespective of the direction of the well boundary 6, the deviation of the well boundary 6 is suppressed because for each of all the implantation types, the impurity implantation is performed from a plurality of directions such that projecting components H are cancelled with each other and further because the plurality of directions are set to four directions that cross one another at right angles. Thus, in accordance with the method of the first preferred embodiment, even when the STI 2 and the well boundary 6 directly therebelow are set to any directions, it is possible to obtain a breakdown voltage of element isolation that is high and approximately uniform. Thereby, the degree of integration of semiconductor devices can be increased while ensuring the degree of freedom of layout design.

4. Second Preferred Embodiment

Figure 10:
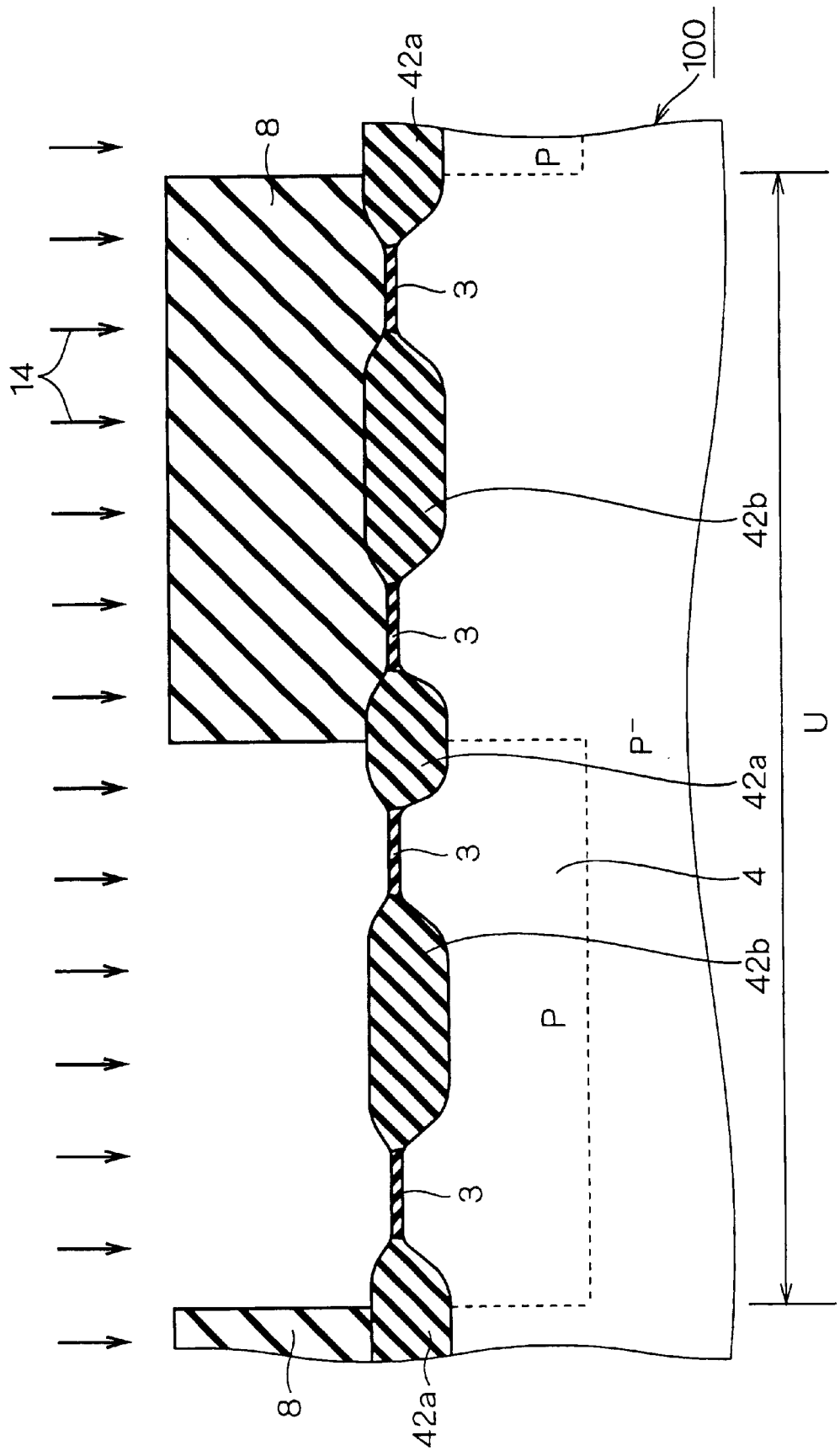
FIGS. 10 and 11 are diagrams of the steps of manufacturing a semiconductor device in order to verify a method of a second preferred embodiment.
Figure 11:
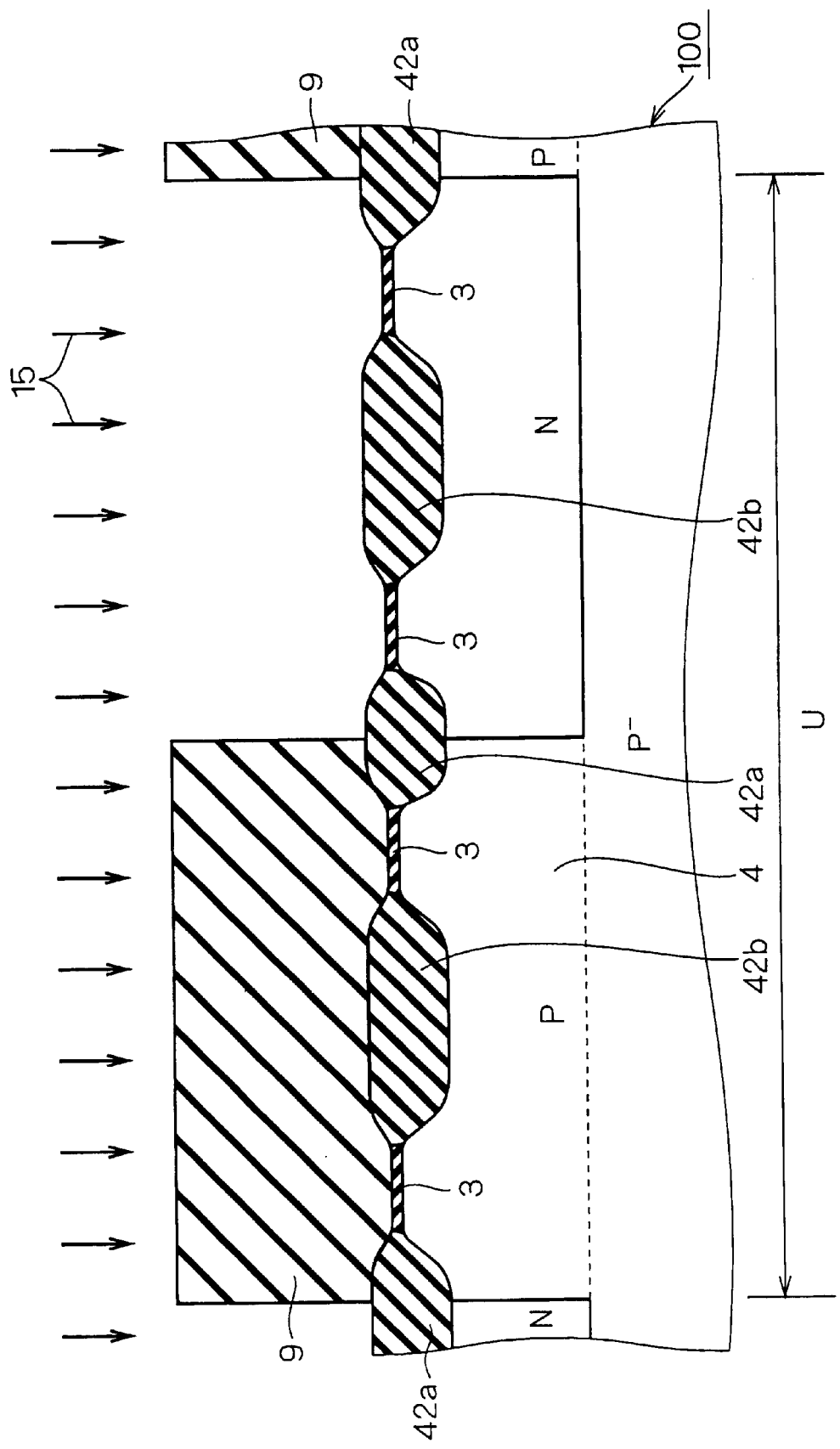
Figure 12:
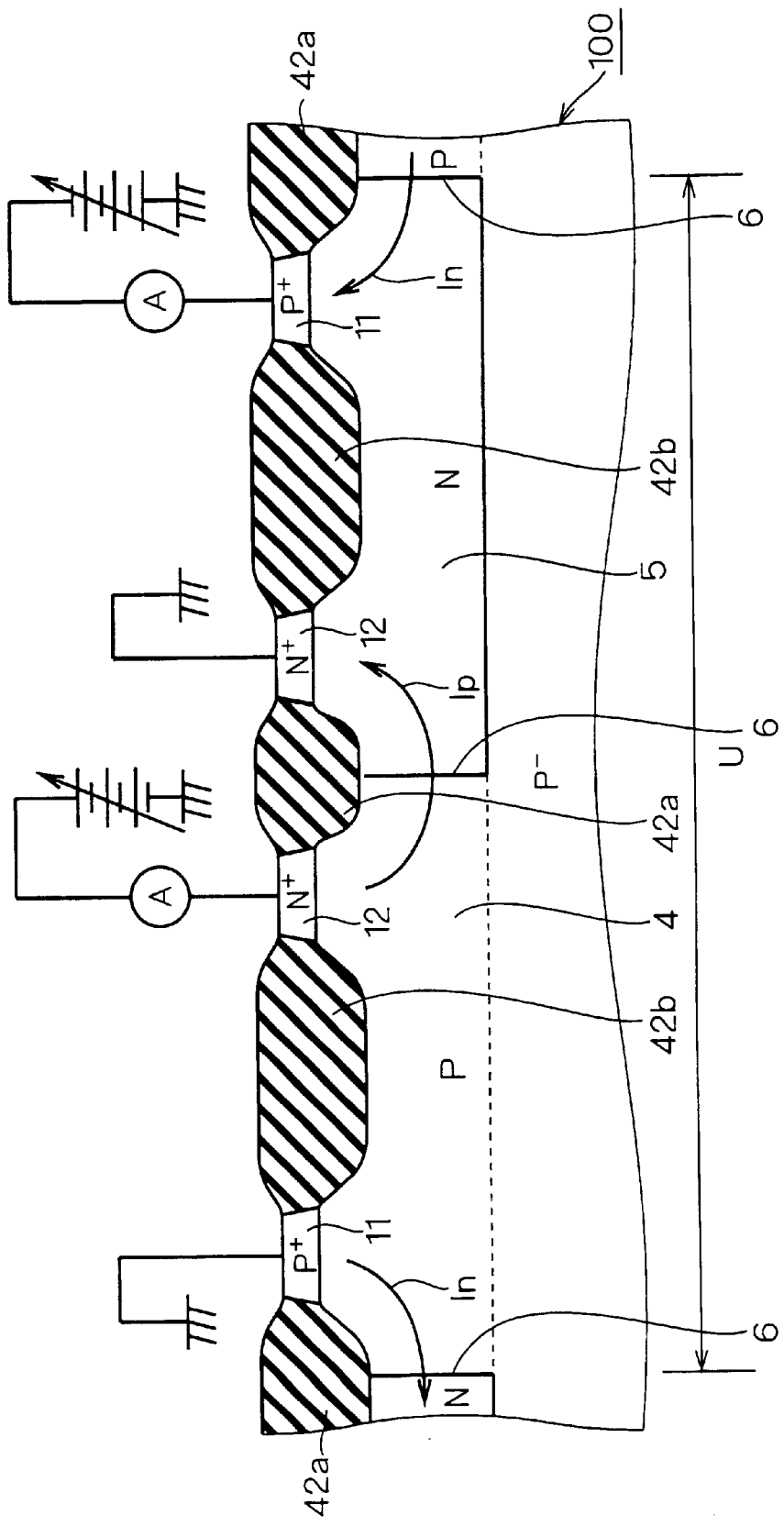
FIG. 12 is a diagram illustrating a measuring method for verifying the method of the second preferred embodiment.

In a method of a second preferred embodiment, as shown in the steps of FIGS. 10 to 12, LOCOSs 42a and 42b are formed instead of the STIs 2a and 2b in the steps of FIGS. 2 to 4. The thickness of an insulting film 3 is set to 20 nm, the width of the LOCOS 42a is set to 0.5 µm, and the thickness of the LOCOSs 42a and 42b are set to 300 nm. The thickness and width of a resist 8 are set to 2.2 µm and 2.0 µm, respectively. The thickness and width of a resist 9 are set to 2.2 µm and 5.0 µm, respectively.

Impurity implantation for forming wells are performed as follows. In a P type impurity implantation, by using boron as the impurity element, a first implantation at an energy of 230 keV and a dose of $2 \times 10^{13}$ atom/cm$^3$, and a second implantation at an energy of 120 keV and a dose of $1 \times 10^{12}$ atom/cm$^3$, are performed in succession. In an N type impurity implantation, phosphorus is used as the impurity element, and the energy and dose are set to 300 keV and $1 \times 10^{13}$ atom/cm$^3$, respectively. That is, three implantation types are used in the above impurity implantations. The above conditions have a slight numerical difference from the conditions of the conventional method, however, it is not a substantial difference.

Figure 13:
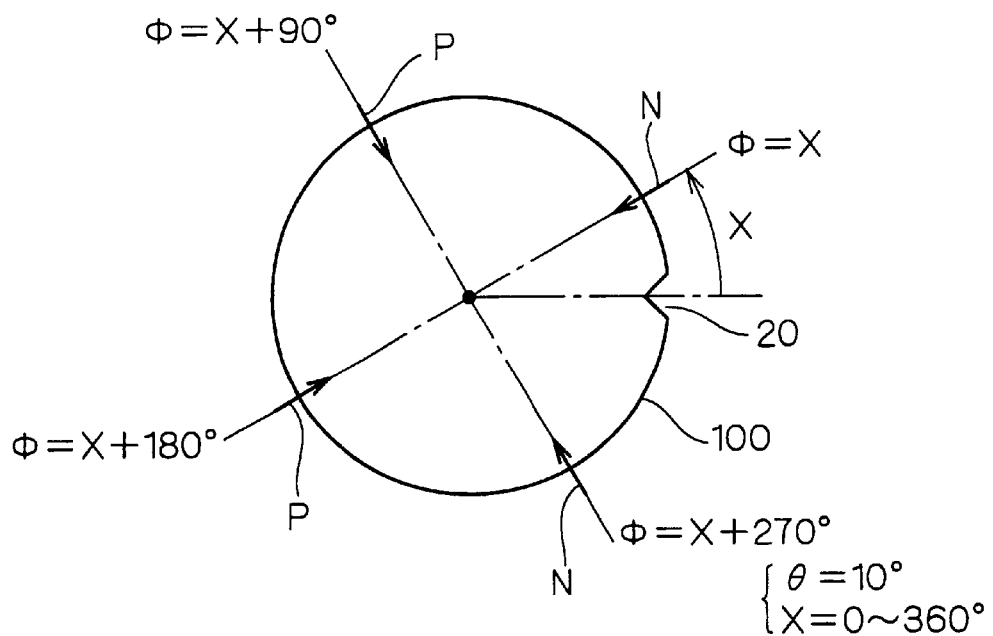
FIG. 13 is a diagram illustrating an implantation method of the second preferred embodiment.

Referring to FIG. 13, the P type impurity and N type impurity are implanted from such a direction that projecting components H are opposed to each other. Specifically, the tilt angle θ of the three implantation types is respectively fixed to 10°. As to the deflection angle φ, one implantation type of the N type impurity is set to two directions: X, and X+270°, and each of two implantation types of the P type impurity are set to two directions: X+90°, and X+180°.

Figure 14:
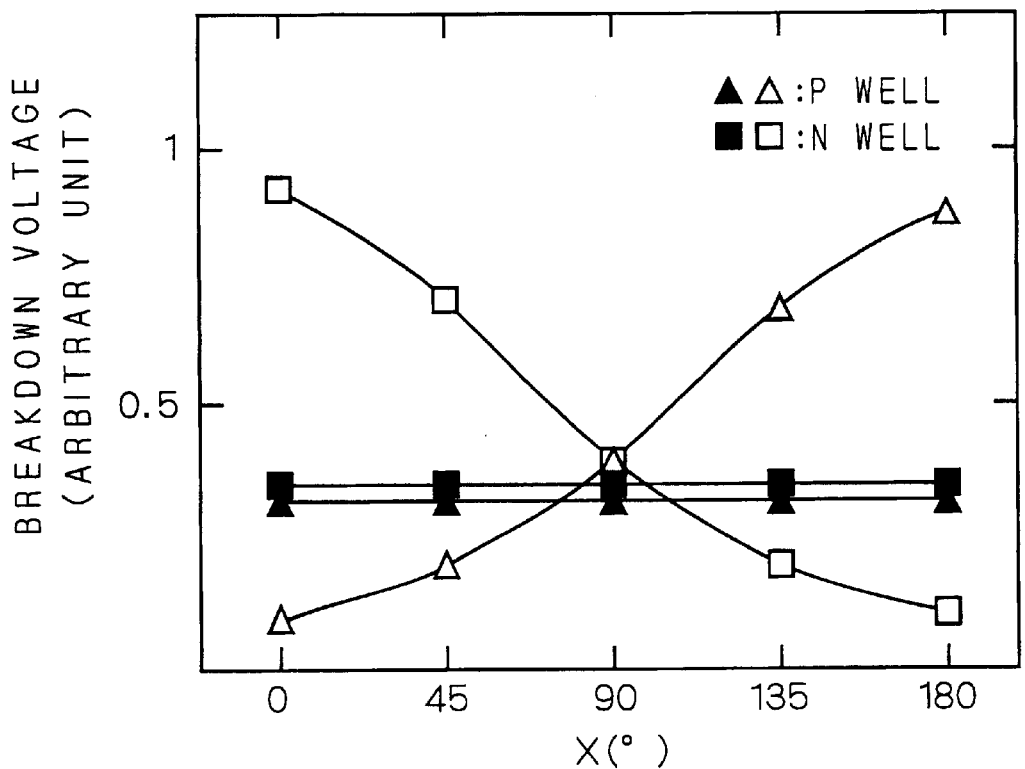
FIG. 14 is a graph showing the result of measurement made for the method of the second preferred embodiment.

FIG. 14 is a graph showing the results of measurement. As shown in FIG. 14, the breakdown voltage of element isolation hardly changes in the P well 4 and N well 5, and there are no noticeable differences between the P well 4 and N well 5. Their breakdown voltage of element isolation are close to the value at X=90°+n×180° in the results of the conventional method, and are greater than the lower value of the two values at X=45°+n×90°.

The results of FIG. 14 indicates that irrespective of the direction of the well boundary 6, the deviation of the well boundary 6 is suppressed because the impurity implantations are performed from a plurality of directions such that projecting components H are cancelled with each other, among all the implantation types of the N type impurity and all the implantation types of the P type impurity, and further because the plurality of directions are set to four directions that cross one another at right angles. The results of FIG. 14 also indicates that the same effect of improving the breakdown voltage of element isolation because of the implantation from a plurality of directions, can also be obtained by using either the STI or LOCOS as an isolation structure.

Thus, in accordance with the method of the second preferred embodiment, even when the LOCOS 42 and the well boundary 6 directly therebelow are set to any directions, it is able to obtain a breakdown voltage of element isolation that is high and approximately uniform. Thereby, the degree of integration of semiconductor devices can be increased while ensuring the degree of freedom of layout design. Although the implantation direction is set to four directions, only two-direction implantation per implantation type is sufficient. Therefore, the number of steps of implantation is reduced to simplify the implantation process.

5. Third Preferred Embodiment

With a method of a third preferred embodiment, in the steps of FIGS. 2 to 4, the thickness of an insulting film 3 is set to 20 nm, the width of a STI 2a is set to 0.4 µm, and the thickness of the STIs 2a and 2b are set to 400 nm. The thickness and width of a resist 8 are set to 2.5 µm and 2.0 µm, respectively. The thickness and width of a resist 9 are set to 2.5 µm and 5.0 µm, respectively.

Impurity implantation for forming wells are simulated as follows. In a P type impurity implantation, by using boron as the impurity element, a first implantation at an energy of 280 keV and a dose of $2\times10^{13}$ atom/cm$^3$, and a second implantation at an energy of 160 keV and a dose of $1\times10^{12}$ atom/cm$^3$, are performed in succession. In an N type impurity implantation, by using phosphorus as the impurity element, a first implantation at an energy of 390 keV and a dose of $1\times10^{13}$ atom/cm$^3$, and a second implantation at an energy of 270 keV and a dose of $1\times10^{12}$ atom/cm$^3$, are performed in succession. That is, four implantation types are used in the above impurity implantations.

Figure 15:
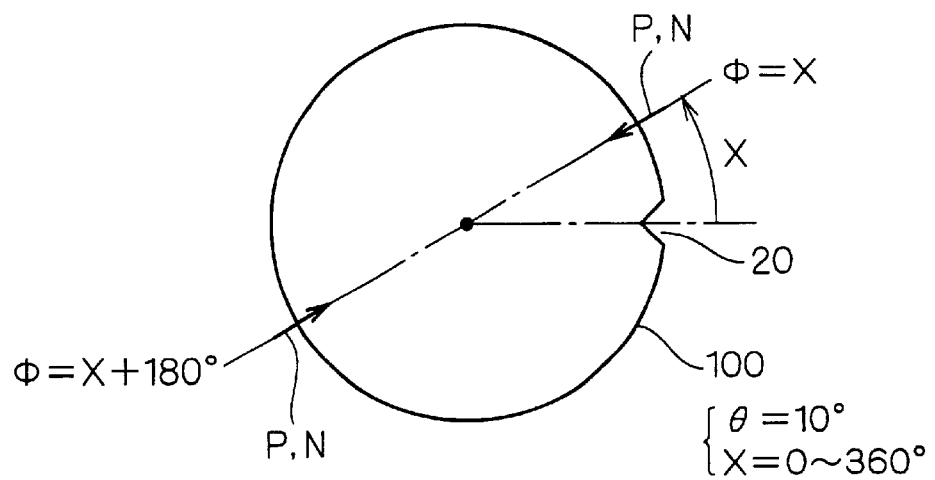
FIG. 15 is a diagram illustrating an implantation method of a third preferred embodiment.

Referring to FIG. 15, the P type impurity and N type impurity are implanted from a plurality of directions. Specifically, for the four implantation types, their tilt angle θ is fixed to 10°, and their deflection angle φ is set to two directions: X, and X+180°. That is, the implantation directions of the four implantation types are set to such two directions that projecting components H are opposed to each other on a line along the main surface.

Figure 16:
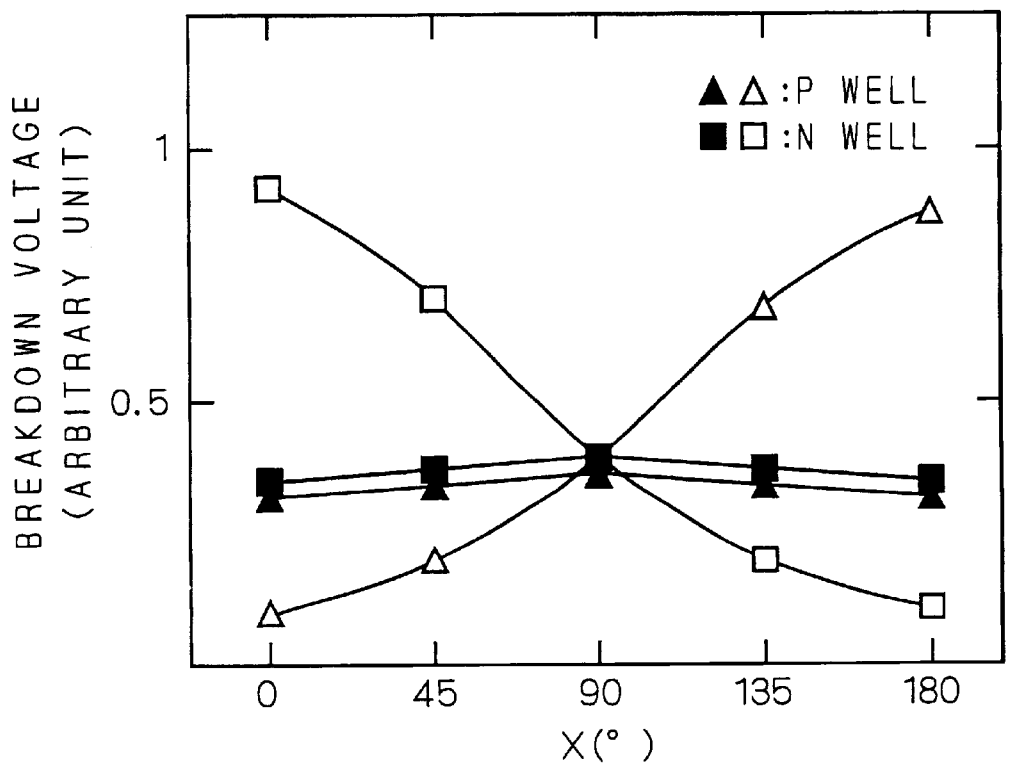
FIG. 16 is a graph showing the results of measurement made for the method of the third preferred embodiment.

FIG. 16 is a graph showing the results of measurement. As shown in FIG. 16, the breakdown voltages of element isolation in the P well 4 and N well 5 change gently as angle X changes, and there are no noticeable differences in the breakdown voltages of element isolation between the P well 4 and N well 5. Their breakdown voltages of element isolation are close to the value at X=90°+n×180° in the results of the conventional method, and are also greater than the lower value of the two values at X=45°+n×90°.

The results of FIG. 16 indicates that even if a plurality of directions are two opposite directions, when for each of all the implantation types, the impurity implantation is performed from a plurality of directions such that projecting components H are cancelled with each other, the deviation of the well boundary 6 is suppressed without strongly depending on the direction of the well boundary 6. Thus, in accordance with the method of the third preferred embodiment, even when the STI 2 and the well boundary 6 directly therebelow are set to any directions, it is able to obtain a breakdown voltage of element isolation that is high and close to a constant value. Thereby, the degree of integration of semiconductor devices can be increased while ensuring the degree of freedom of layout design. In addition, since only the two-direction implantation per implantation type is sufficient, the number of steps of implantation is reduced to simplify the implantation process.

6. Fourth Preferred Embodiment

With a method of a fourth preferred embodiment, in the steps shown in FIGS. 2 to 4, the thickness of an insulating film 3, the width of a STI 2a, the thickness of the STIs 2a and 2b, the thickness and width of a resist 8, and the thickness and width of a resist 9, are all set to the same as the third preferred embodiment.

Impurity implantation for forming wells are simulated as follows. In a P type impurity implantation, boron is used as the impurity element, the energy is set to 100 keV, and the dose is set to $5\times10^{12}$ atom/cm$^3$. In an N type impurity implantation, phosphorus is used as the impurity element, the energy is set to 290 keV, and the dose is set to $5\times10^{13}$ atom/cm$^3$. That is, only two implantation types which is the minimum are used in the above impurity implantations.

Figure 17:
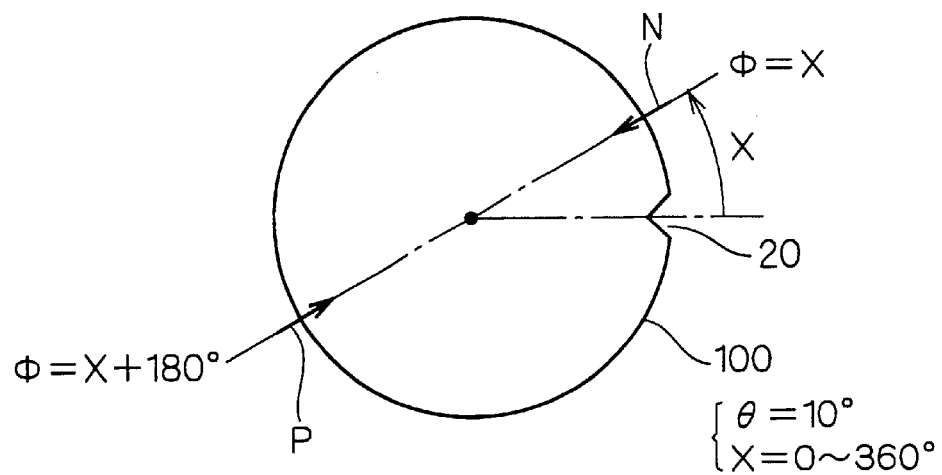
FIG. 17 is a diagram illustrating an implantation method of a fourth preferred embodiment.

Referring to FIG. 17, the P type impurity and N type impurity are implanted from such a direction that projecting components H are opposed to each other. Specifically, for the three implantation types, their tilt angle θ is fixed to 10°. The deflection angle φ of the N type impurity is set to a single direction of φ=X, and that of the P type impurity is set to a single direction of X+180°.

Figure 18:
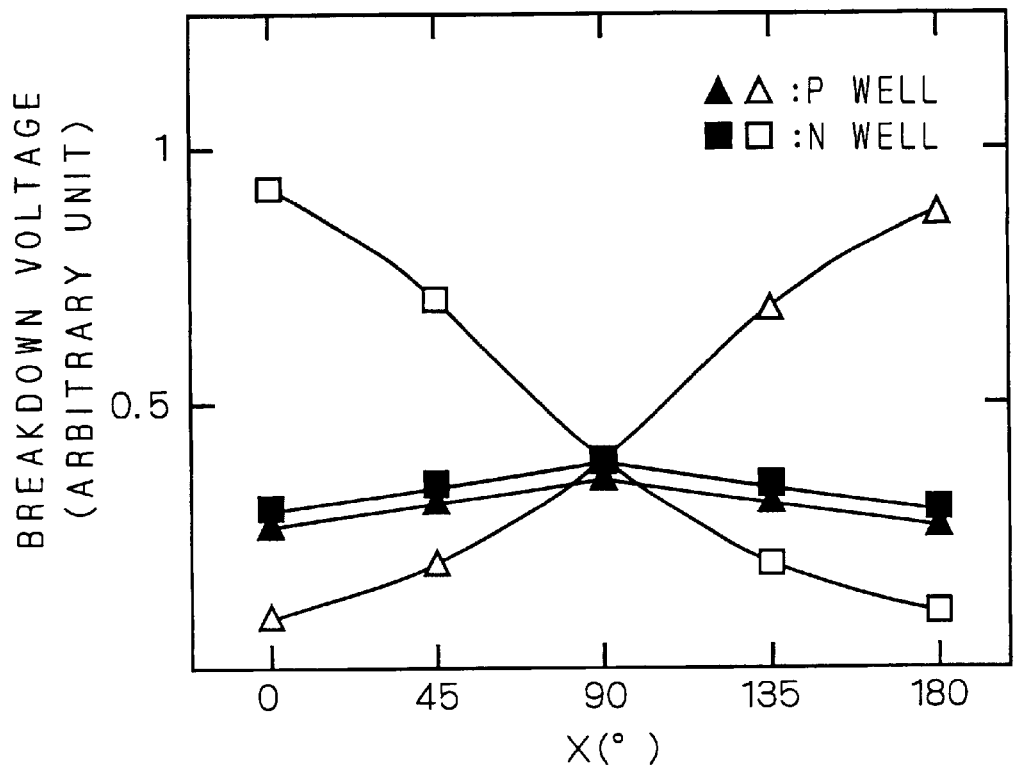
FIG. 18 is a graph showing the result of measurement made for the method of the fourth preferred embodiment.

FIG. 18 is a graph showing the results of measurement. As shown in FIG. 18, the breakdown voltages of element isolation in the P well 4 and N well 5 change relatively gently as angle X changes, and there are no noticeable differences in the breakdown voltage of element isolation between the P well 4 and N well 5. Their breakdown voltage of element isolation are close to the value at X=90°+n×180° in the results of the conventional method, and are also greater than the lower value of the two values at X=45°+n×90°.

The results of FIG. 18 indicates that even if a plurality of directions are two opposite directions, the deviation of the well boundary 6 is minimized without strongly depending on the direction of the well boundary 6, by performing the impurity implantation from a plurality of directions such that projecting components H are cancelled with each other, among all the implantation types of the N type impurity and all the implantation types of the P type impurity. Thus, in accordance with the method of the fourth preferred embodiment, even when the STI 2 and the well boundary 6 directly therebelow are set to any directions, it is able to obtain a breakdown voltage of element isolation that is high and relatively stable. Thereby, the degree of integration of semiconductor devices can be increased while ensuring the degree of freedom of layout design. In addition, since a single direction implantation per implantation type is sufficient, the steps of implantation is more reduced to further simplify the implantation process.

7. Fifth Preferred Embodiment

With a method of a fifth preferred embodiment, in the steps shown in FIGS. 2 to 4, the thickness of an insulating film 3, the width of a STI 2a, the thickness of the STIs 2a and 2b, the thickness and width of a resist 8, and the thickness and width of a resist 9, are all set to the same as the third preferred embodiment.

Impurity implantation for forming wells are simulated as follows. In a P type impurity implantation, by using boron as the impurity element, a first implantation at an energy of 280 keV and a dose of $2\times10^{13}$ atom/cm$^3$, and a second implantation at an energy of 160 keV and a dose of $1\times10^{12}$ *atom/cm*$^3$, are performed in succession. In an N type impurity implantation, phosphorus is used as the impurity element, and the energy and dose are set to 390 keV and $1\times10^{13}$ atom/cm$^3$, respectively. That is, three implantation types are used in the above impurity implantations.

Figure 19:
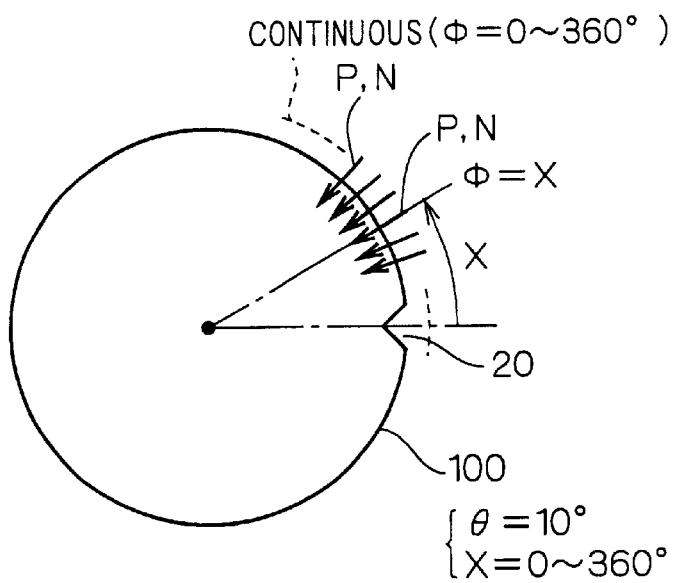
FIG. 19 is a diagram illustrating an implantation method of a fifth preferred embodiment.

Referring to FIG. 19, the P type impurity and N type impurity are implanted from a plurality of directions. Specifically, for the three implantation types, their tilt angle θ is fixed to 10°, and their deflection angle φ is set to 0 to 360°, i.e., all directions that is continuous infinitely. In other words, the implantation directions of the three implantation types are all set to such a continuously infinite direction that projecting components H are opposed to each other on every line along the main surface. In this case, angle X means nothing. This is because that the implantation conditions remain unchanged even if the angle X is set to any value.

Figure 20:
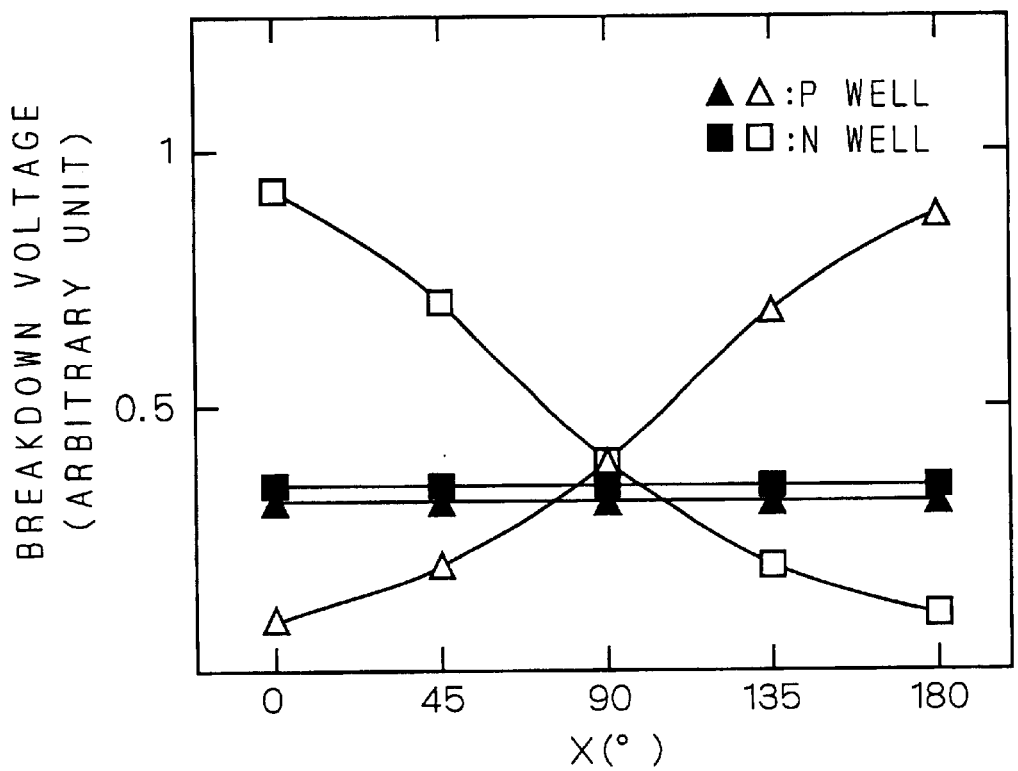
FIG. 20 is a graph showing the results of measurement made for the method of the fifth preferred embodiment.

FIG. 20 is a graph showing the results of measurement. As might be expected, there are no changes in the breakdown voltage of element isolation in both the P well 4 and N well 5, and there are no noticeable differences therebetween. Their breakdown voltage of element isolation are close to the value at X=90°+n×180° in the results of the conventional method, and are also greater than the lower value of the two values at X=45°+n×90°.

The results of FIG. 20 indicates that irrespective of the direction of the well boundary 6, the deviation of the well boundary 6 is suppressed because, for all the implantation types, the impurity implantation is performed from a plurality of directions such that projecting components H are cancelled with each other, and further because the plurality of directions are set to a continuously infinite direction, i.e., in all directions. Thus, in accordance with the method of the fifth preferred embodiment, even when the STI 2 and the well boundary 6 directly therebelow are set to any directions, it is possible to obtain a breakdown voltage of element isolation that is high and uniform. Thereby, the degree of integration of semiconductor devices can be increased while ensuring the degree of freedom of layout design.

8. Sixth Preferred Embodiment

With a method of a sixth preferred embodiment, in the steps shown in FIGS. 2 to 4, the thickness of an insulating film 3, the width of a STI 2a, the thickness of the STIs 2a and 2b, the thickness and width of a resist 8, and the thickness and width of a resist 9, are all set to the same as the third preferred embodiment.

Impurity implantation for forming wells are simulated as follows. In a P type impurity implantation, by using boron as the impurity element, a first implantation at an energy of 280 keV and a dose of $2 \times 10^{13}$ atom/cm$^3$, and a second implantation at an energy of 160 keV and a dose of $1 \times 10^{12}$ atom/cm$^3$, are performed in succession. In an N type impurity implantation, phosphorus is used as the impurity element, and the energy and dose are set to 390 keV and $1 \times 10^{13}$ atom/cm$^3$, respectively. That is, three implantation types are used in the above impurity implantations.

Figure 21:
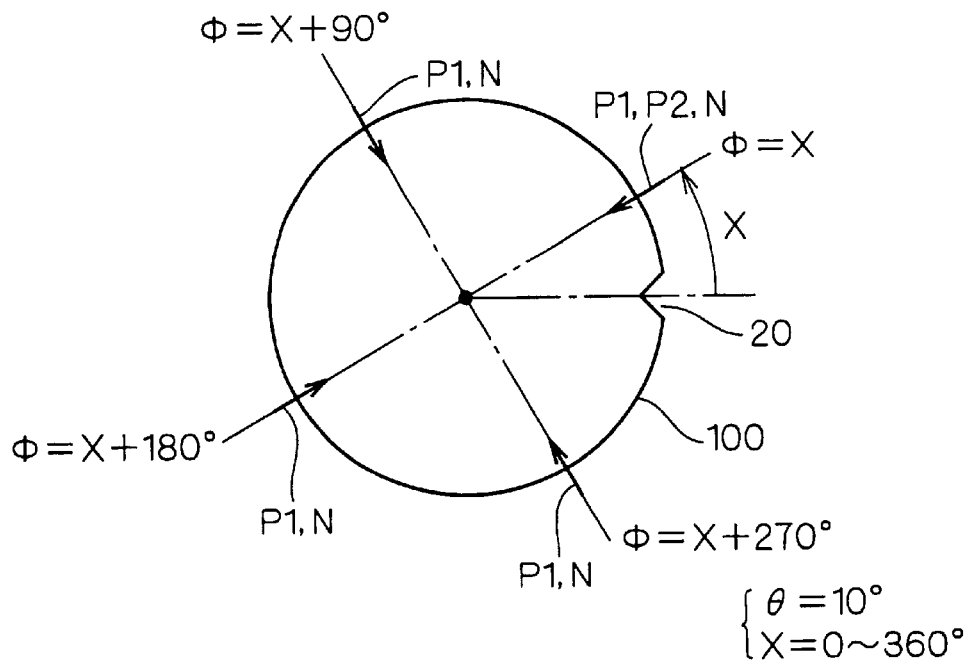
FIG. 21 is a diagram illustrating an implantation method of a sixth preferred embodiment.

Referring to FIG. 21, as to one of the two implantation types of the P type impurity (which is represented by P1 in FIG. 21) and one implantation type of the N type impurity, implantation is performed from a plurality of directions. Specifically, the tilt angle θ of the three implantation types of P1, P2 and N, is respectively fixed to 10°. As to the deflection angle φ, only the two implantation types P1 and N are set to four directions: X, X+90°, X+180°, and X+270°, and the implantation type P2 is set to a single direction of φ=X. That is, the two implantation types P1 and N are set to such four directions that projecting components H are opposed to each other on two lines that cross each other at right angles along the main surface.

Figure 22:
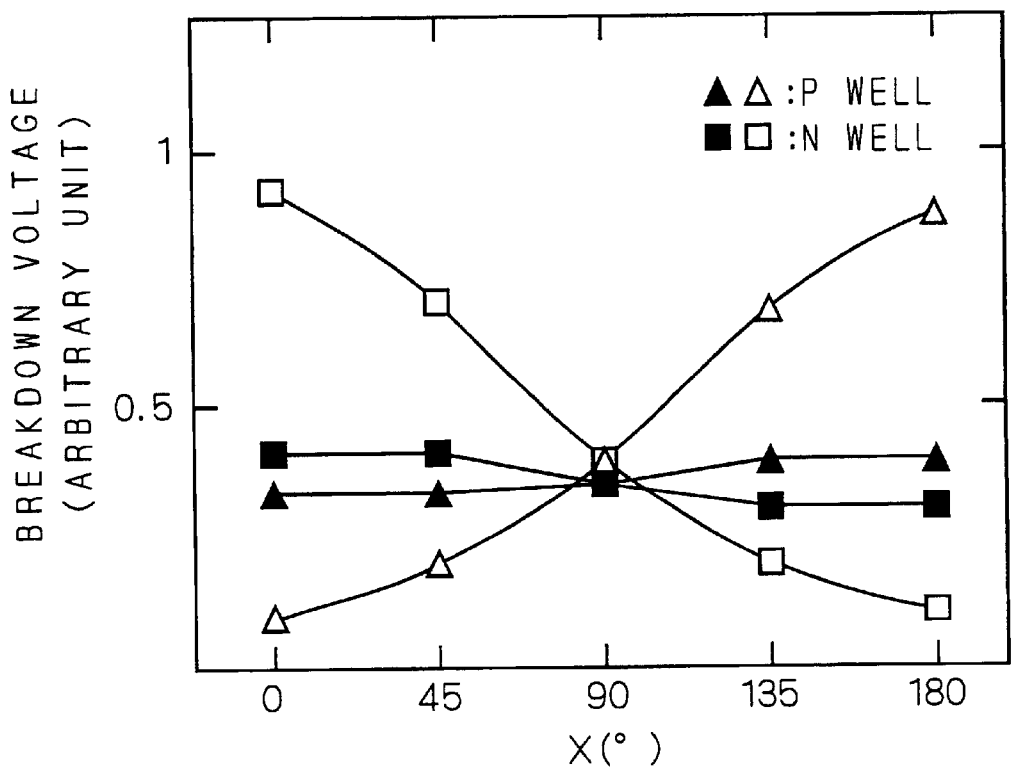
FIG. 22 is a graph showing the results of measurement made for the method of the sixth preferred embodiment.

FIG. 22 is a graph showing the results of measurement. As shown in FIG. 22, the breakdown voltages of element isolation in both the P well 4 and N well 5 change gently as angle X changes, and there are no noticeable differences in the breakdown voltage of element isolation between the P well 4 and N well 5. Their breakdown voltage of element isolation are close to the value at X=90°+n×180° in the results of the conventional method, and are also greater than the lower value of the two values at X=45°+n×90°.

The results of FIG. 22 indicates that the deviation of the well boundary 6 is relaxed without strongly depending on the direction of the well boundary 6, if only part of the implantation types is implanted from a plurality of directions such that projecting components H are cancelled with each other. Thus, in accordance with the method of the sixth preferred embodiment, even when the STI 2 and the well boundary 6 directly therebelow are set to any directions, it is able to obtain a breakdown voltage of element isolation that is high and relatively stable. Thereby, the degree of integration of semiconductor devices can be increased while ensuring the degree of freedom of layout design. In addition, since there is no need to set the implantation directions of all the implantation types to a plurality of directions, the number of implantation steps is reduced to simplify the implantation process.

9. Seventh Preferred Embodiment

With a method of a seventh preferred embodiment, in the steps shown in FIGS. 2 to 4, the thickness of an insulating film 3, the width of a STI 2a, the thickness of the STIs 2a and 2b, the thickness and width of a resist 8, and the thickness and width of a resist 9, are all set to the same as the third preferred embodiment.

Impurity implantation for forming wells are simulated as follows. In a P type impurity implantation, by using boron as the impurity element, a first implantation at an energy of 280 keV and a dose of $2 \times 10^{13}$ atom/cm$^3$, and a second implantation at an energy of 160 keV and a dose of $1 \times 10^{12}$ atom/cm$^3$, are performed in succession. In an N type impurity implantation, phosphorus is used as the impurity element, and the energy and dose are set to 390 keV and $1 \times 10^{13}$ atom/cm$^3$, respectively. That is, three implantation types are used in the above impurity implantations.

Figure 23:
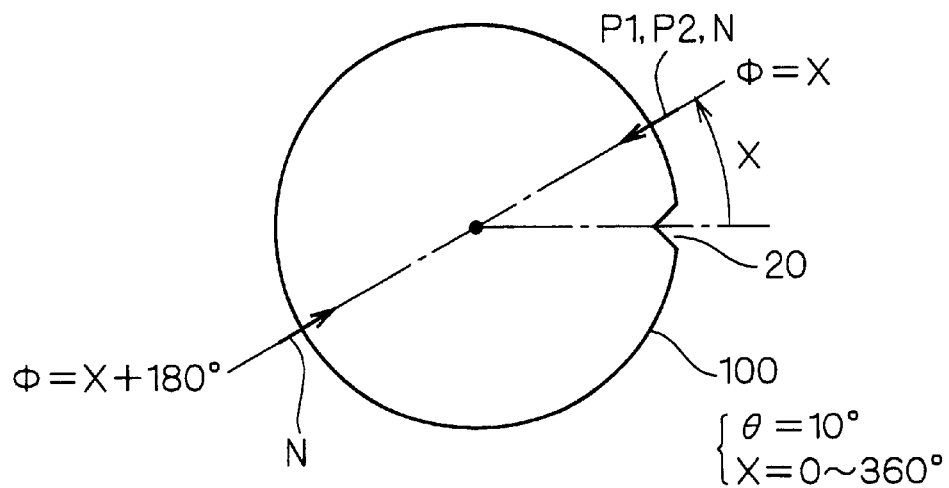
FIG. 23 is a diagram illustrating an implantation method of a seventh preferred embodiment.

Referring to FIG. 23, as to one implantation type of the N type impurity, implantation is performed from a plurality of directions. Specifically, the tilt angle θ of the three implantation types of P1, P2 and N, is respectively fixed to 10°. As to the deflection angle φ, only one implantation type N is set to two directions: X, and X+180°, and the two implantation types P1 and P2 are set to a single direction of φ=X. That is, the implantation direction of only the implantation type N is set to such two directions that projecting components H are opposed to each other on a line along the main surface.

Figure 24:
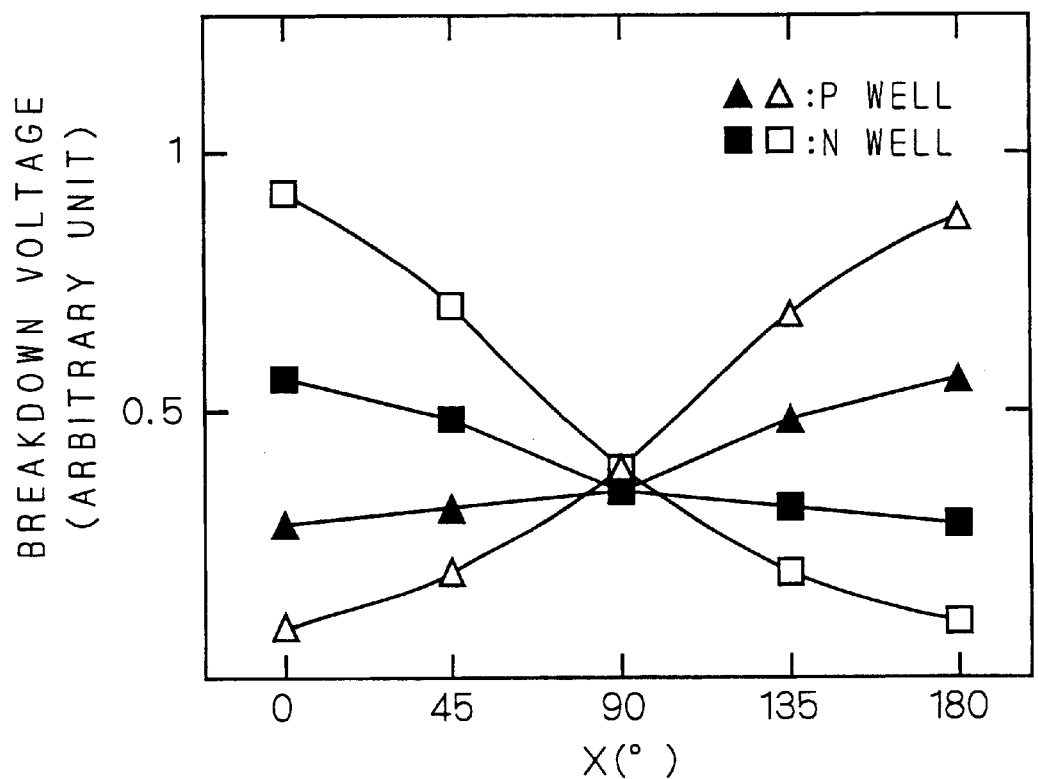
FIG. 24 is a graph showing the results of measurement made for the method of the seventh preferred embodiment.

FIG. 24 is a graph showing the results of measurement. As shown in FIG. 24, the breakdown voltage of element isolation in both the P well 4 and N well 5 changes gently as angle X changes, as compared to the results of the conventional method. The minimum values of their breakdown voltages of element isolation are greater than the minimum values in the conventional method.

The results of FIG. 24 indicates that the deviation of the well boundary 6 is relaxed irrespective of the direction of the well boundary 6, if only one implantation type is implanted from a plurality of directions such that the projecting components H are cancelled with each other. Thus, in accordance with the method of the seventh preferred embodiment, even when the STI 2 and the well boundary 6 directly therebelow are set to any directions, it is able to obtain a breakdown voltage of element isolation that is high and relatively stable. Thereby, the degree of integration of semiconductor devices can be increased while ensuring the degree of freedom of layout design. In addition, since setting of only two-direction for a single implantation type is sufficient, the number of implantation steps is reduced to simplify the implantation process.

10. Summary of Verification Results

Firstly, the verification results obtained by the simulations in the foregoing preferred embodiments shows that, if only for part of a plurality of implantation types contributing to the well formation, implantation is performed from a plurality of directions such that projecting components H are cancelled with each other, it is possible to improve the uniformity of the breakdown voltage of element isolation against the direction of the well boundary, and also realize a high breakdown voltage of element isolation in all directions. The verification results also shows that the same effect is obtainable by performing the implantation from a plurality of directions such that the projecting components H are cancelled with each other, between different implantation types. These sufficiently suggest that the corresponding effect can be obtained if only for part of a plurality of implantation types contributing to the well formation, implantation is performed from a plurality of directions such that projecting components H are cancelled with each other, between different implantation types.

Secondly, the above verification results shows that the above-mentioned effect is enhanced with increasing the number of the implantation types which are implanted from a plurality of directions such that projecting components H are cancelled with each other, alternatively, with increasing the number of directions to be selected such that the projecting components H are cancelled with each other. The effectiveness of the above-mentioned effect and the simplicity of the implantation steps are in a trade-off relationship. Therefore, at the job site of manufacturing semiconductor devices, a suitable method should be selected and executed from a plurality of options, depending on the application of the semiconductor device.

11. Eighth Preferred Embodiment

In the methods of the first to seventh preferred embodiments, when performing impurity implantations, various values were selected for implantation energy, along with implantation direction. In the following preferred embodiments, description will proceed to an optimum range of implantation energy which was obtained through simulation.

According to a method of an eighth preferred embodiment, in the steps of FIGS. 2 to 4, the thickness of an insulating film 3 is set to 20 nm, the width of a STI 2a is set variously, and the thickness of the STIs 2a and 2b is set to the same as the third preferred embodiment. The thickness of both resists 8 and 9 is set to 1.0 $\mu$m, and their width is set to 5.0 $\mu$m.

Impurity implantation for forming wells is simulated as follows. A P type impurity implantation is performed by using boron as an impurity element, at an energy of 120 keV ($R_p \approx 0.35$ $\mu$m) and a dose of $5 \times 10^{12}$ atom/cm$^3$. An N type impurity implantation is performed by using phosphorus as an impurity element, at an energy of 250 keV ($R_N \approx 0.31$ $\mu$m) and a dose of $1 \times 10^{13}$ atom/cm$^3$. That is, two implantation types are used in these impurity implantations.

As used herein, the reference $R_p$ indicates the range of the P type impurity in a silicon oxide (the material of the STIs 2a and 2b), and the reference $R_N$ indicates the range of the N type impurity in the silicon oxide. Under the condition of implantation energy, the ranges $R_p$ and $R_N$ are both set to be less than the thickness of the STI 2a (400 nm). Therefore, as shown in FIG. 25, the peak of a concentration $C_p$ of the P type impurity in a P well 4 and the peak of a concentration $C_N$ of the N type impurity in an N well 5 are both located at a portion shallower than the bottom portion of the STI 2a in a semiconductor substrate 100. In FIG. 25, regions 31 and 32 indicate a region of which impurity concentration is close to a peak value.

In order to evaluate the method of the eighth preferred embodiment, simulation is also performed for a method to be compared. In the method to be compared, the width of a STI 2a is set variously. The thickness of the STIs 2a and 2b, the thickness and width of a resist 8, and the thickness and width of a resist 9, are all set to the same as the third preferred embodiment.

In the method to be compared, impurity implantation for forming wells is performed as follows. In a P type impurity implantation, by using boron as an impurity element, a first implantation at an energy of 250 keV ($R_p \approx 0.67$ $\mu$m) and a dose of $2 \times 10^{13}$ atom/cm$^3$, and a second implantation at an energy of 160 keV ($R_p \approx 0.47$ $\mu$m) and a dose of $1 \times 10^{12}$ atom/cm$^3$, are performed in succession. An N type impurity implantation is performed by using phosphorus as an impurity element, at an energy of 400 keV ($R_N \approx 0.41$ $\mu$m) and a dose of $1 \times 10^{13}$ atom/cm$^3$. That is, three implantation types are used in these impurity implantations.

In the method to be compared, both ranges $R_p$ and $R_N$ are set to be more than the thickness of the STI 2a. Therefore, as shown in FIG. 26, the peak of a concentration $C_p$ of the P type impurity in a P well 4 and the peak of a concentration $C_N$ of the N type impurity in an N well 5 are both located at a portion deeper than the bottom portion of the STI 2a in a semiconductor substrate 100.

Figure 27:
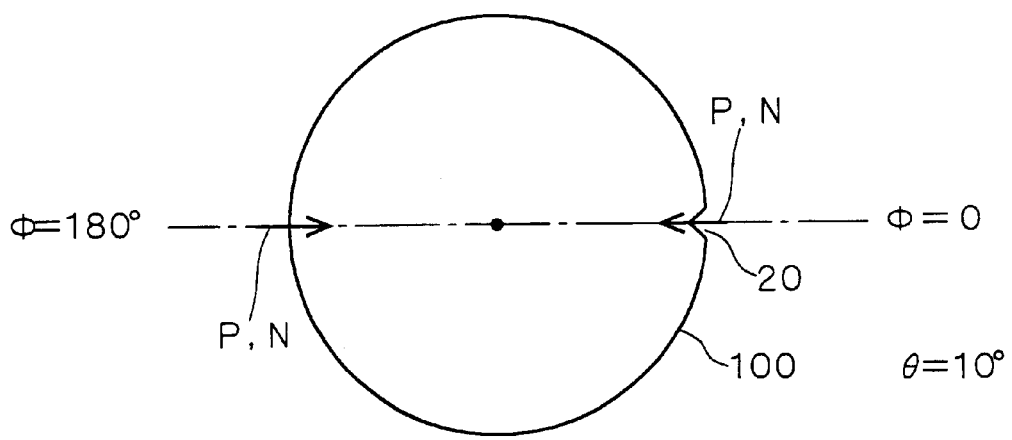
FIG. 27 is a diagram illustrating an implantation method of the eighth preferred embodiment.

Referring to FIG. 27, in the method of the eighth preferred embodiment (FIG. 25) and the method to be compared (FIG. 26), both of the P and N type impurities are implanted from plural directions. More specifically, for all the plural implantation types, the tilt angle $\theta$ is fixed to 10°, and the deflection angle $\phi$ is set to two directions of 0° and 180°. That is, the implantation direction of every implantation type is set to such two directions that projecting components H are opposed to each other in a straight line along the main surface.

Figure 28:
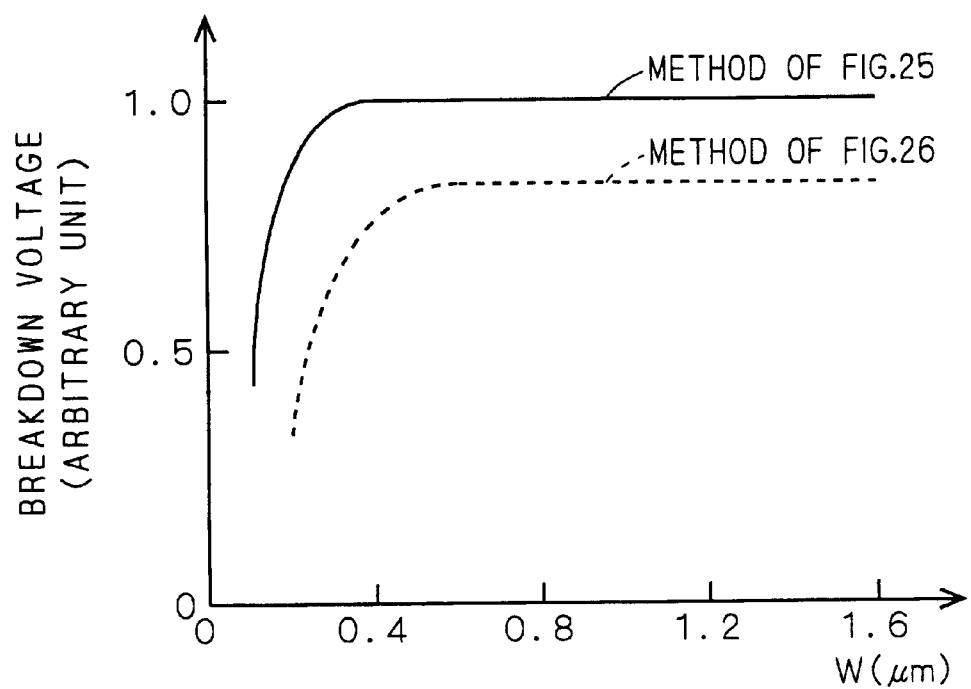
FIG. 28 is a graph showing the result of measurement in the method of the eighth preferred embodiment.

FIG. 28 presents a graph of the results of measurement, which shows the breakdown voltage for various isolation widths W (i.e., the width W of the STI 2a in FIG. 25). In FIG. 28, a dotted line represents the result of measurement (FIG. 7) obtained with the method to be compared (FIG. 26), and a solid line represents the result of measurement obtained with the eighth preferred embodiment. With each method, little or no difference in breakdown voltage of element isolation is produced between the P well 4 and N well 5.

As seen from FIG. 28, throughout the whole range of isolation width W, the method of the eighth preferred embodiment provides a higher breakdown voltage of element isolation than the method to be compared. Particularly when the isolation width W is set to 0.4 $\mu$m as in the third preferred embodiment, the breakdown voltage of element isolation has already reached a saturation value (the value of 1 in an arbitrary unit). The results of measurement in FIG. 28 indicates that the breakdown voltage of element isolation can be further improved by setting such that the range $R_p$ of the P type impurity and the range $R_N$ of the N type impurity are less than the thickness of the STI 2a (in other words, "depth"), in addition to such impurity implantation from plural directions that projecting components H are cancelled with each other.

When the ranges $R_p$ and $R_N$ are more than the thickness of the STI 2a, the impurity concentration decreases at the portions of the P well 4 and N well 5 which make contact with the side wall surface of the STI 2a, as shown in FIG. 26. As a result, as the applied voltage increases, a depletion layer 30 extends toward the surface of the semiconductor substrate 100. On the other hand, when the ranges $R_p$ and $R_N$ are less than the thickness of the STI 2a, the impurity concentration increases at the portions of the P well 4 and N well 5 which make contact with the side wall surface of the STI 2a, as shown in FIG. 25. As a result, even if the applied voltage increases, it is avoided that the depletion layer 30 extends toward the surface of the semiconductor substrate 100. That is, an increase in the impurity concentration in the vicinity of the side wall surface of the STI 2a permits an increase in effective isolation width, thereby improving the breakdown voltage of element isolation.

Figure 29:
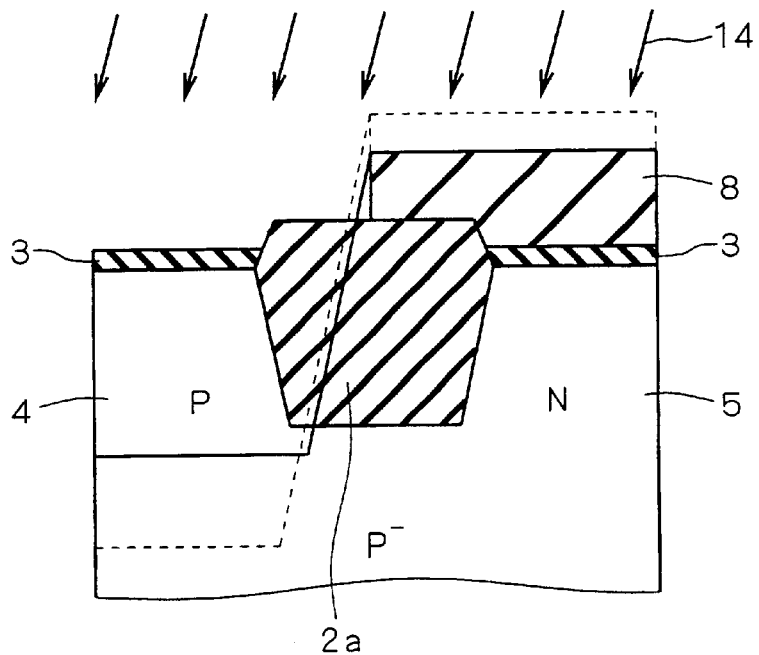
FIGS. 29 and 30 are diagrams showing the effect of the eighth preferred embodiment.
Figure 30:
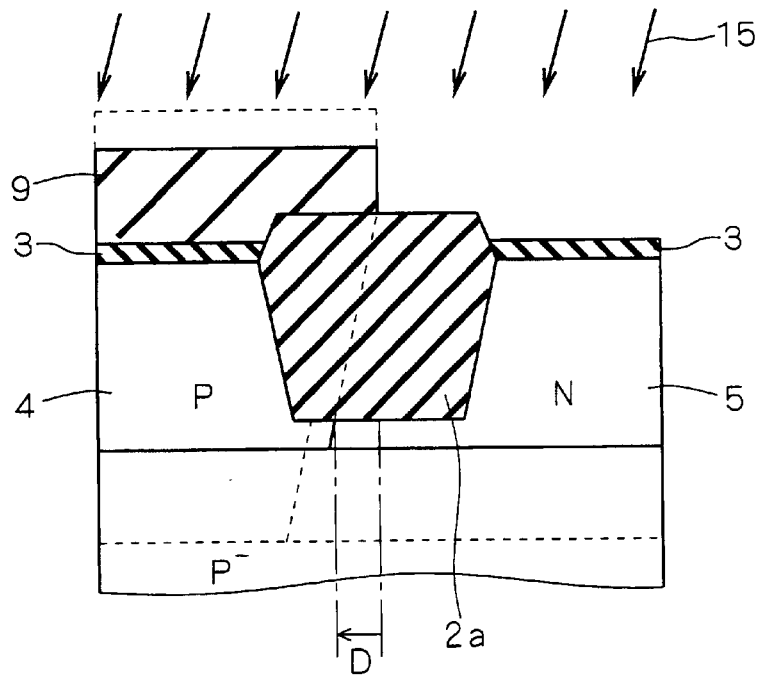

In the eighth preferred embodiment, the thickness of the resists 8 and 9 (1.0 $\mu$m) is also set to be less than the thickness of the resists 8 and 9 (2.5 $\mu$m) in the method to be compared. This is because in the method of the eighth preferred embodiment, the implantation energy is set to a low value and it is therefore unnecessary to set the resists 8 and 9 to be thick. As a result, the shadowing effect due to the resist 8 is more prevented than the method to be compared, as shown in FIG. 29. At the same time, the unnecessary implantation toward the immediately underside of the resist 9 is prevented as shown in FIG. 30. In FIGS. 29 and 30, a dotted line represents the step of implantation in the method to be compared. As seen from FIG. 30, with the method of the eighth preferred embodiment, a deviation D of a well boundary 6 is reduced to be shorter than that with the method to be compared. This also contributes to improvement in the breakdown voltage of element isolation.

The foregoing mechanism providing the results of FIG. 28 sufficiently proves the following conclusion. Based on the discussion of FIGS. 29 and 30, it is proved with sufficient accuracy that even when no implantation is performed from such plural directions that projecting components H are opposed to each other, if the ranges $R_p$ and $R_N$ are set to be less than the thickness of the STI 2a, the breakdown voltage of element isolation is improved to some extent, than the method to be compared. Specifically, it can be concluded that the breakdown voltage of element isolation is still improved merely by setting the ranges $R_p$ and $R_N$ to be less than the thickness of the STI 2a , as compared to the conventional method wherein no implantation is performed from such plural directions that projecting components H are opposed to each other, and the ranges $R_p$ and $R_N$ are set to be more than the thickness of the STI 2a.

Thus, the method of the eighth preferred embodiment enables to improve the breakdown voltage of element isolation. Additionally, since it is sufficient if a two-direction implantation is performed for each implantation type, the number of steps of implantation can be reduced to simplify the steps of implantation.

12. Ninth Preferred Embodiment

According to a method of a ninth preferred embodiment, in the steps of FIGS. 2 to 4, the thickness of an insulating film 3 is set to 20 nm, the width of a STI 2a is set to 0.45 μm, and the thickness of the STIs 2a and 2b is set to 350 nm. The thickness of both resists 8 and 9 is set to 2.0 μm, and their width is set to 5.0 μm.

Impurity implantation for forming wells is simulated as follows. In a P type impurity implantation, boron is used as an impurity element, the implantation energy is set at various values within the range of 90 to 200 keV ($R_p \approx 0.28$ to 0.56 μm), and the dose is set to $5 \times 10^{12}$ atom/cm$^3$. An N type impurity implantation is performed by using phosphorus as an impurity element, at an energy of 350 keV ($R_N \approx 0.37$ μm) and a dose of $1 \times 10^{13}$ atom/cm$^3$. That is, two implantation types are used in these impurity implantations.

Figure 31:
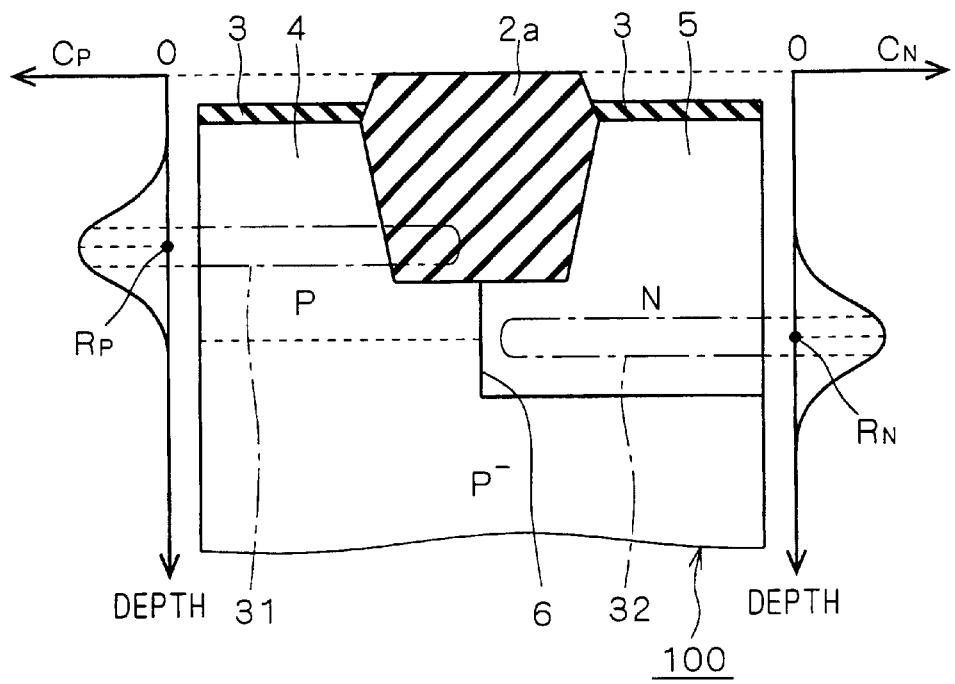
FIG. 31 is a diagram illustrating a method according to a ninth preferred embodiment.

Under the condition of implantation energy, the range $R_N$ is set to be more than the thickness of the STI 2a (350 nm). The range $R_p$ is widely set from a value less than the thickness of the STI 2a to a value more than that. Referring to FIG. 31, when the range $R_p$ is set to be less than the thickness of the STI 2a, the peak of a concentration $C_p$ of the P type impurity in a P well 4 is located at a portion shallower than the bottom portion of the STI 2a, and the peak of a concentration $C_N$ of the N type impurity in an N well 5 is located at a portion deeper than the bottom portion of the STI 2a, in a semiconductor substrate 100.

Figure 32:
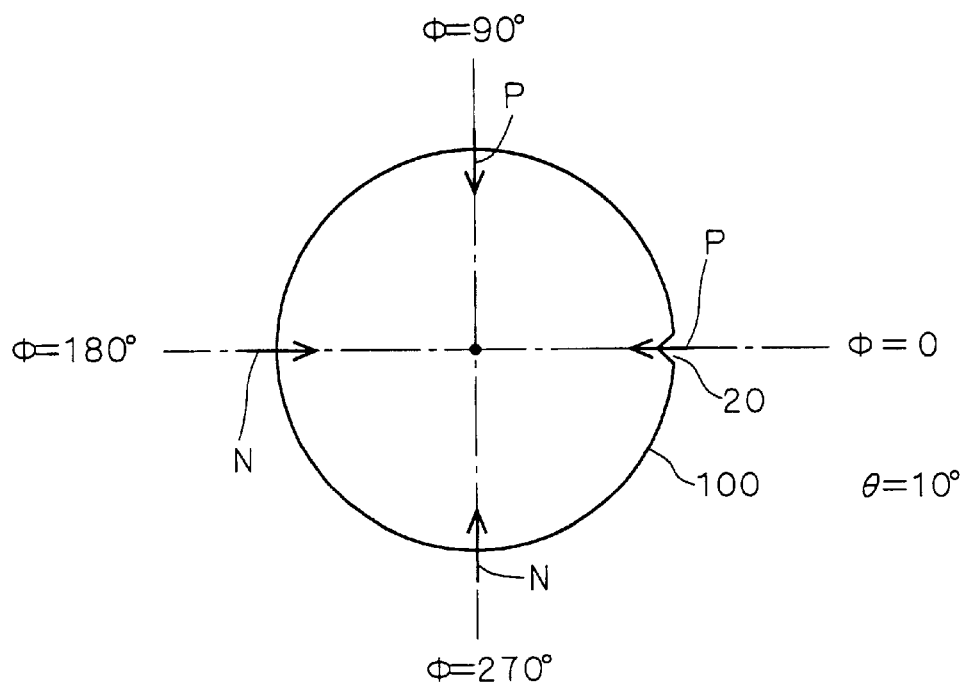
FIG. 32 is a diagram illustrating an implantation method of the ninth preferred embodiment.

Referring to FIG. 32, the P and N type impurities are implanted from such plural directions that projecting components H are opposed to each other. More specifically, with respect to each of the two implantation types, the tilt angle θ is fixed to 10°. The deflection angle φ of the P type impurity is set to two directions of 0° and 90°, and that of the N type impurity is set to two directions of 180° and 270°.

Figure 33:
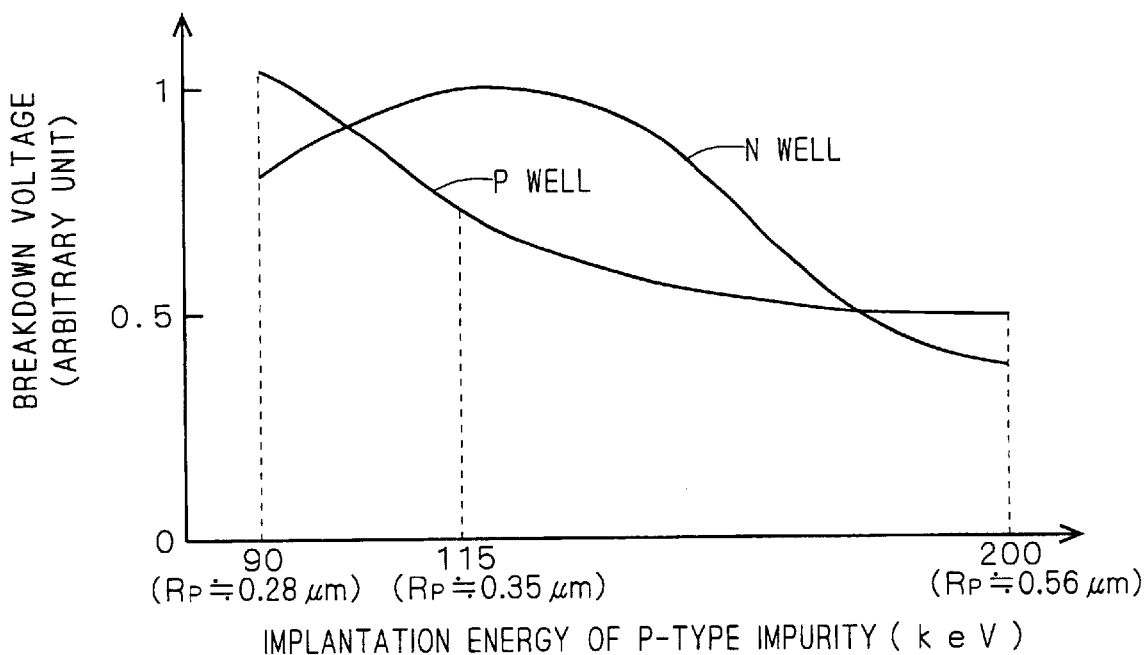
FIG. 33 is a graph showing the result of measurement in the method of the ninth preferred embodiment.

FIG. 33 presents a graph showing the result of measurement. FIG. 33 shows that even if the range $R_N$ of the N type impurity is more than the depth of the STI 2a, the breakdown voltage of element isolation of the P well 4 is more increased as the implantation energy of the P type impurity is lowered. Especially when the range $R_p$ of the P type impurity is less than the depth of the STI 2a, the breakdown voltage of element isolation is noticeably improved. That is, FIG. 33 proves that, of the range $R_p$ of the P type impurity and the range $R_N$ of the N type impurity, even when only the range $R_p$ is set to be less than the depth of the STI 2a, the effect of improving the breakdown voltage of element isolation can be obtained to some extent. This also shows with sufficient accuracy that even when no implantation is performed from such plural direction that projecting components H are opposed to each other, if only the range $R_p$ is set so as to be less than the thickness of the STI 2a, the breakdown voltage of element isolation can be improved to some extent, as compared to the conventional method.

Thus, the method of the ninth preferred embodiment also enables to improve the breakdown voltage of element isolation. Additionally, since it is sufficient if a two-direction implantation is performed for each implantation type, the number of steps of implantation can be reduced to simplify the steps of implantation.

13. Tenth Preferred Embodiment

According to a method of a tenth preferred embodiment, in the steps of FIGS. 2 to 4, the thickness of an insulating film 3 is set to 20 nm, the width of a STI 2a is set to 0.4 μm, and the thickness of the STIs 2a and 2b is set to 330 nm. The thickness and width of a resist 8 are set to 2.5 μm and 5.0 μm, respectively. The thickness and width of a resist 9 are set to 2.5 μm and 2.0 μm, respectively.

Impurity implantation for forming wells is simulated as follows. A P type impurity implantation is performed by using boron as an impurity element, at an energy of 120 keV ($R_p \approx 0.37$ μm) and a dose of $8 \times 10^{12}$ atom/cm$^3$. In an N type impurity implantation, by using phosphorus as an impurity element, the implantation energy is set at various values within the range of 250 to 400 keV ($R_N \approx 0.25$ to 0.41 μm), and the dose is set to $1 \times 10^{13}$ atom/cm$^3$. That is, two implantation types are used in these impurity implantations.

Figure 34:
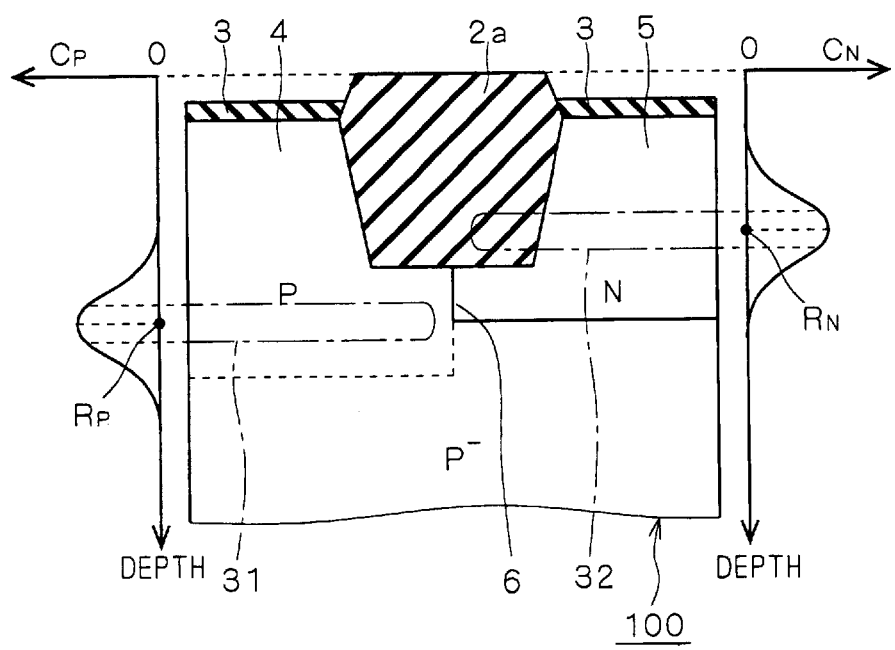
FIG. 34 is a diagram illustrating a method according to a tenth preferred embodiment.

Under the condition of implantation energy, the range $R_p$ is set to be more than the thickness of the STI 2a (330 nm). The range $R_N$ is widely set from a value less than the thickness of the STI 2a to a value more than that. Referring to FIG. 34, when the range $R_N$ is set to be less than the thickness of the STI 2a, the peak of a concentration $C_N$ of the N type impurity in an N well 5 is located at a portion shallower than the bottom portion of the STI 2a, and the peak of a concentration $C_p$ of the P type impurity in a P well 4 is located at a portion deeper than the bottom portion of the STI 2a, in a semiconductor substrate 100. The implantation direction of the P and N type impurities is set to the same as in FIG. 27 of the eighth preferred embodiment.

Figure 35:
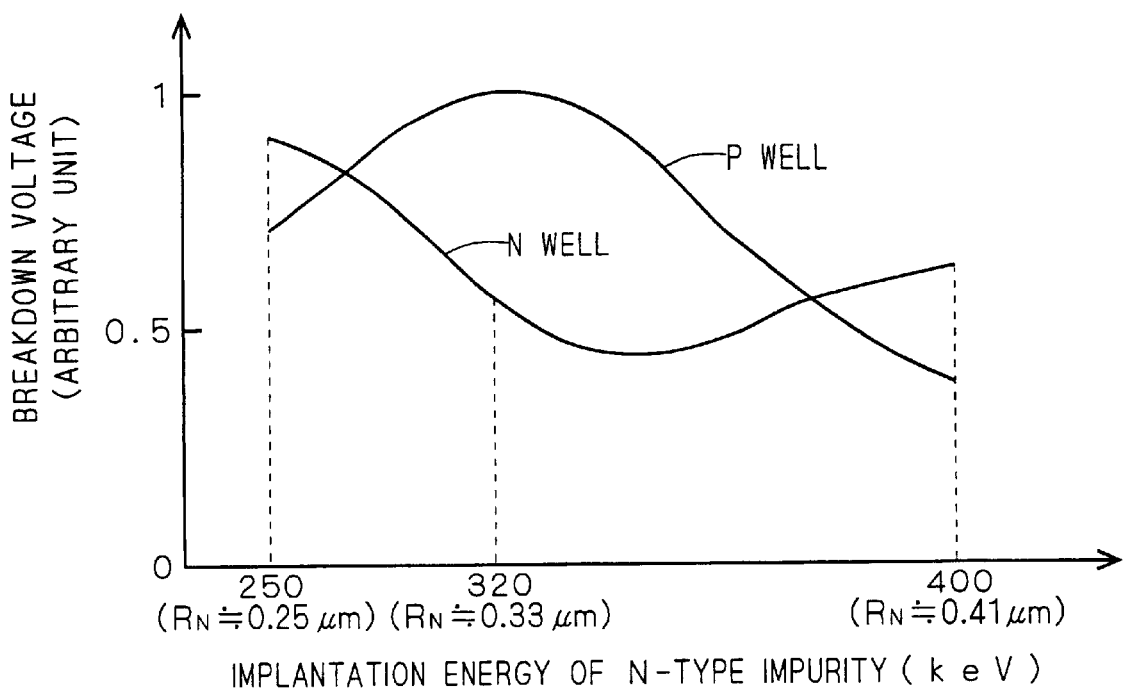
FIG. 35 is a graph showing the result of measurement in the method of the tenth preferred embodiment.

FIG. 35 presents a graph showing the result of measurement. FIG. 35 shows that even if the range $R_p$ of the P type impurity is more than the depth of the STI 2a, the breakdown voltage of element isolation of the N well 5 is more increased as the implantation energy of the N type impurity is lowered. Especially when the range $R_N$ of the N type impurity is less than the depth of the STI 2a, the breakdown voltage of element isolation is noticeably improved. That is, FIG. 35 proves that, of the range $R_p$ of the P type impurity and the range $R_N$ of the N type impurity, even when only the range $R_N$ is set to be less than the depth of the STI 2a, the effect of improving the breakdown voltage of element isolation can be obtained to some extent. This also shows with sufficient accuracy that even when no implantation is performed from such plural direction that projecting components H are opposed to each other, if only the range $R_N$ is set so as to be less than the thickness of the STI 2a, the breakdown voltage of element isolation can be improved to some extent, as compared to the conventional method.

Thus, the method of the tenth preferred embodiment also enables to improve the breakdown voltage of element isolation. Additionally, since it is sufficient if a two-direction implantation is performed for each implantation type, the number of steps of implantation can be reduced to simplify the steps of implantation.

14. Eleventh Preferred Embodiment

According to a method of an eleventh preferred embodiment, in the steps of FIGS. 2 to 4, the thickness of an insulating film 3 is set to 20 nm, the width of a STI 2a is set to 0.4 $\mu$m, and the thickness of the STIs 2a and 2b is set to 300 nm. The thickness of both resists 8 and 9 is set to 0.8 $\mu$m, and their width is set to 5.0 $\mu$m.

Impurity implantation for forming wells is simulated as follows. A P type impurity implantation is performed by using boron as an impurity element, at an energy of 95 keV ($R_p$≈0.30 $\mu$m), and a dose of 5×10$^{12}$ atom/cm$^3$. An N type impurity implantation is performed by using phosphorus as an impurity element, at an energy of 290 keV ($R_N$≈0.30 $\mu$m) and a dose of 1×10$^{13}$ atom/cm$^3$. That is, two implantation types are used in these impurity implantations.

Figure 36:
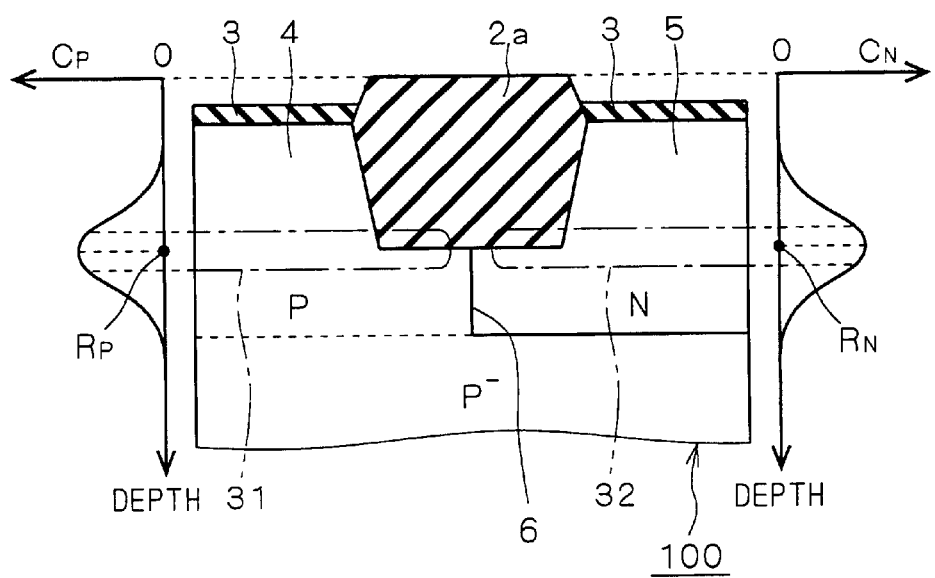
FIG. 36 is a diagram illustrating a method according to an eleventh preferred embodiment.

Under the condition of implantation energy, both ranges $R_p$ and $R_N$ are set to be equal to the thickness of the STI 2a (300 nm). Therefore, as shown in FIG. 36, the peak of a concentration $C_N$ of the N type impurity in an N well 5 and the peak of a concentration $C_p$ of the P type impurity in a P well 4 are both located approximately at such a deep portion as the bottom portion of the STI 2a.

In order to evaluate the method of the eleventh preferred embodiment, simulation is also performed for a method to be compared. In the method to be compared, the thickness of an insulating film 3, the width of a STI 2a, and the thickness of the STIs 2a and 2b, are all set to the same as the eleventh preferred embodiment. The thickness and width of both resists 8 and 9 are all set to the same as the method compared in the eighth preferred embodiment (i.e., the same as the method of the third preferred embodiment). The condition of impurity implantation for forming wells is set to the same as the method compared in the eighth preferred embodiment.

In the method to be compared hereat, both ranges $R_p$ and $R_N$ are set to be more than the thickness of the STI 2a. Therefore, as shown in FIG. 26, the peak of a concentration $C_p$ of the P type impurity in a P well 4 and the peak of a concentration $C_N$ of the N type impurity in an N well 5 are both located at a portion deeper than the bottom portion of the STI 2a in the semiconductor substrate 100.

Figure 37:
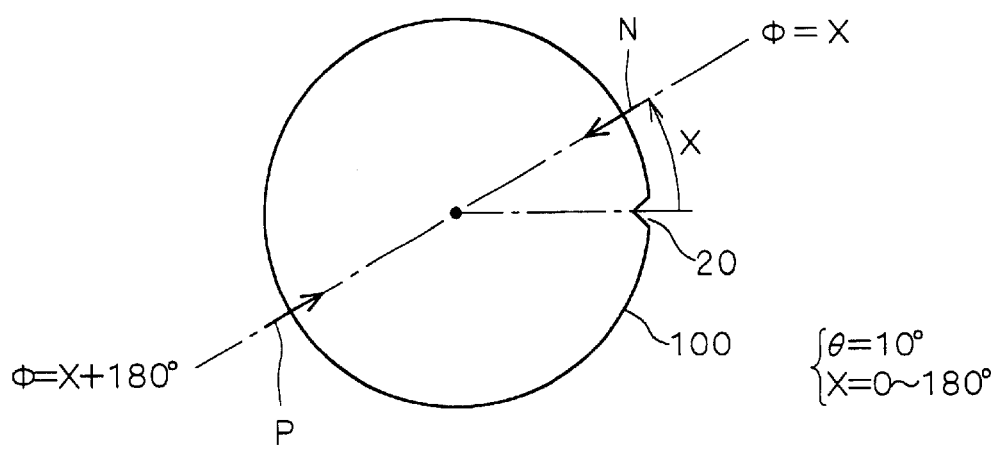
FIG. 37 is a diagram illustrating an implantation method of the eleventh preferred embodiment.

Referring to FIG. 37, in the method of the eleventh preferred embodiment (FIG. 36) and the method compared (FIG. 26), both of the P and N type impurities are implanted from such plural directions that projecting components H are opposed to each other. More specifically, with respect to each of the plural implantation types, the tilt angle θ is fixed to 10°. The deflection angle φ of the N type impurity is set to a single direction of X, and that of the P type impurity is set to a single direction of X+180°, wherein the angle X is set at various values within the range of 0 to 180°.

Figure 38:
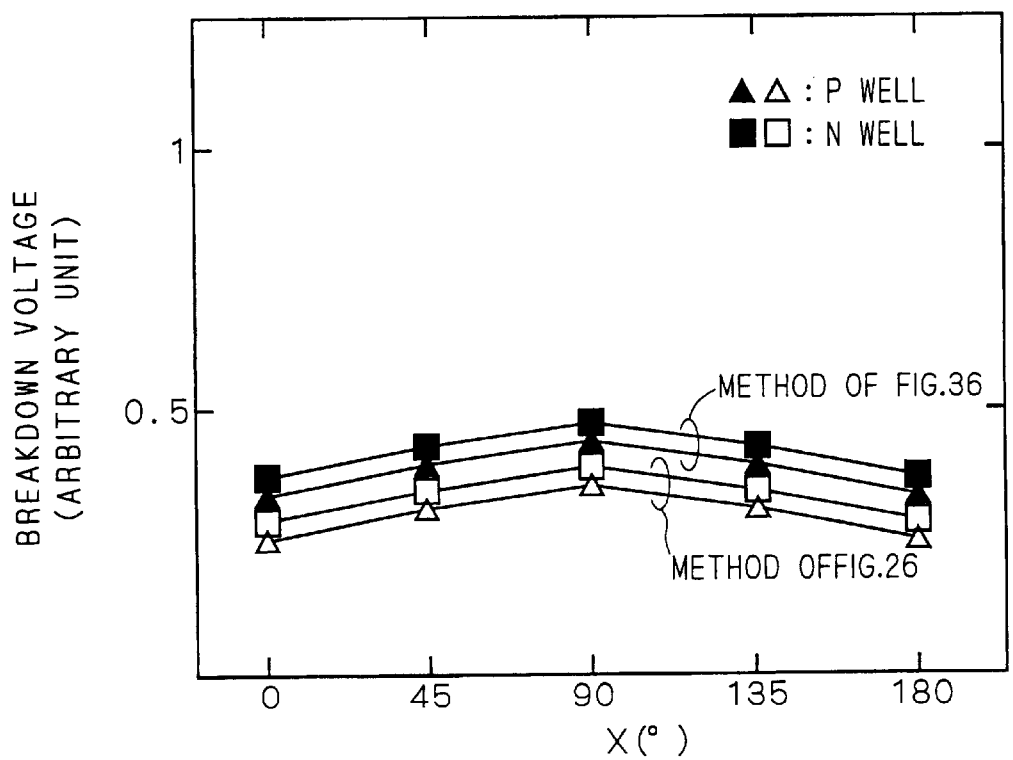
FIG. 38 is a graph showing the result of measurement in the method of the eleventh preferred embodiment.
Figure 39:
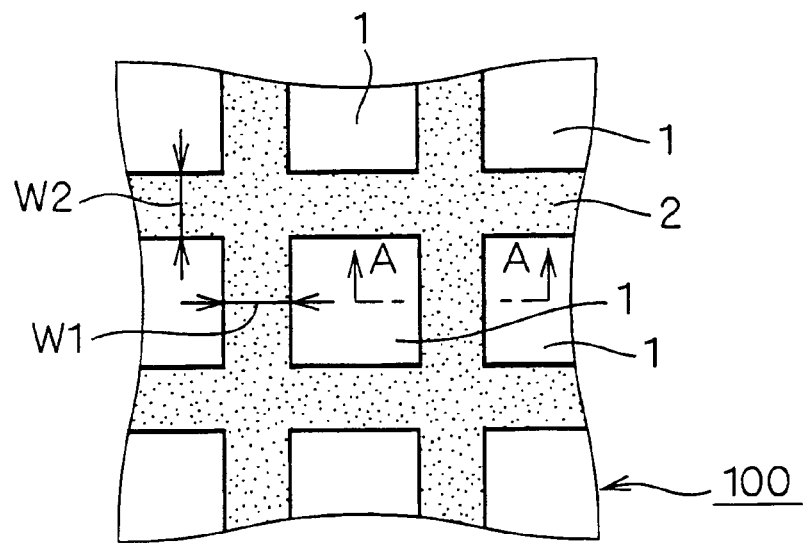
FIG. 39 is a schematic diagram of a plane structure of a semiconductor device according to a conventional method.
Figure 40:
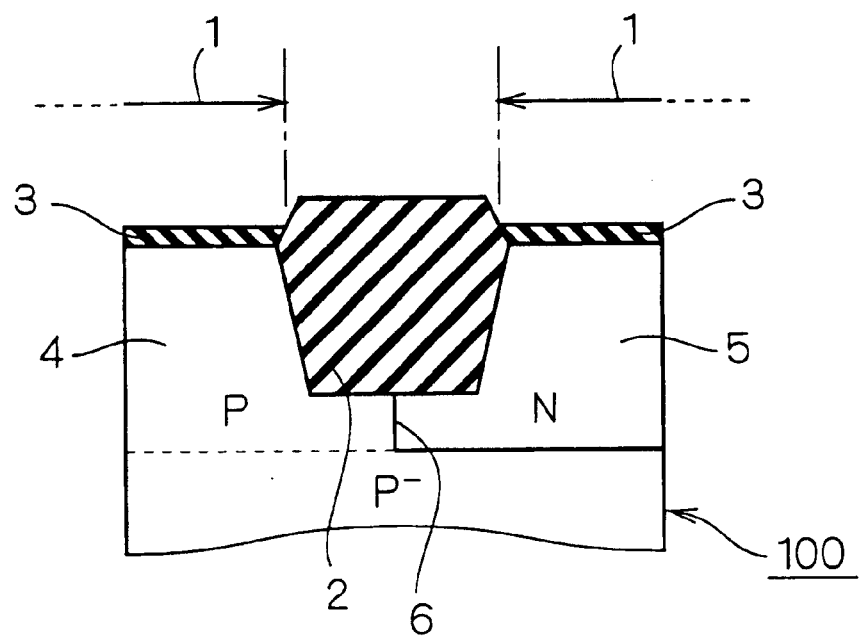
FIGS. 40 to 43 are diagrams of the steps of manufacturing a semiconductor device in the conventional method.
Figure 41:
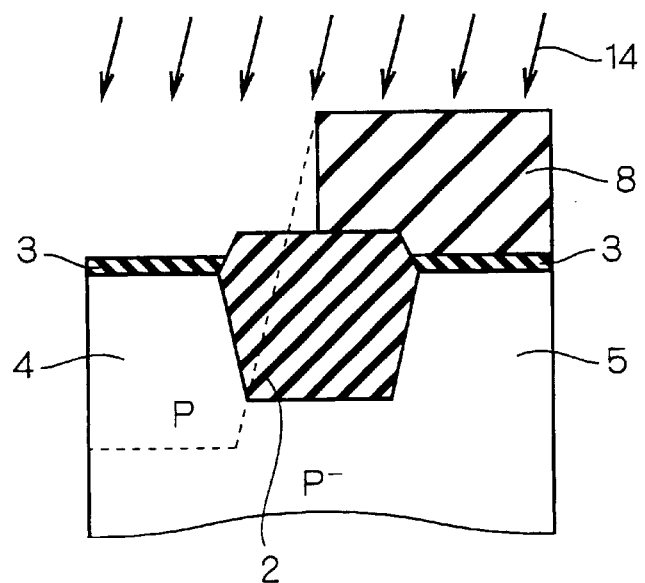
Figure 42:
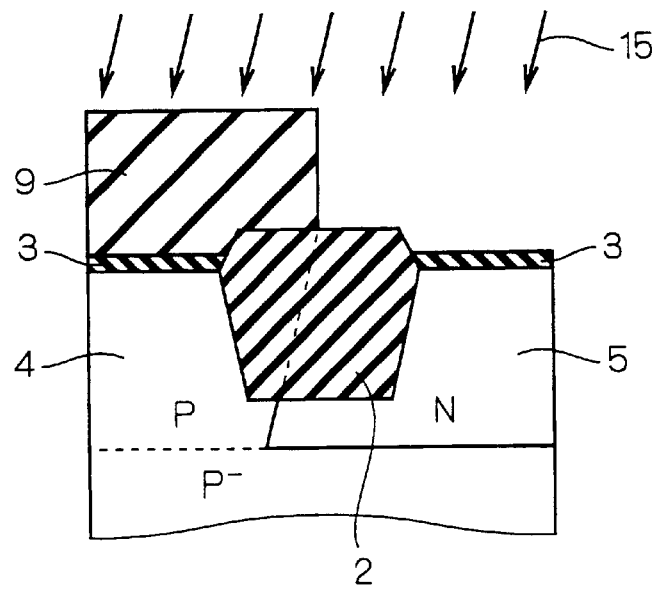
Figure 43:
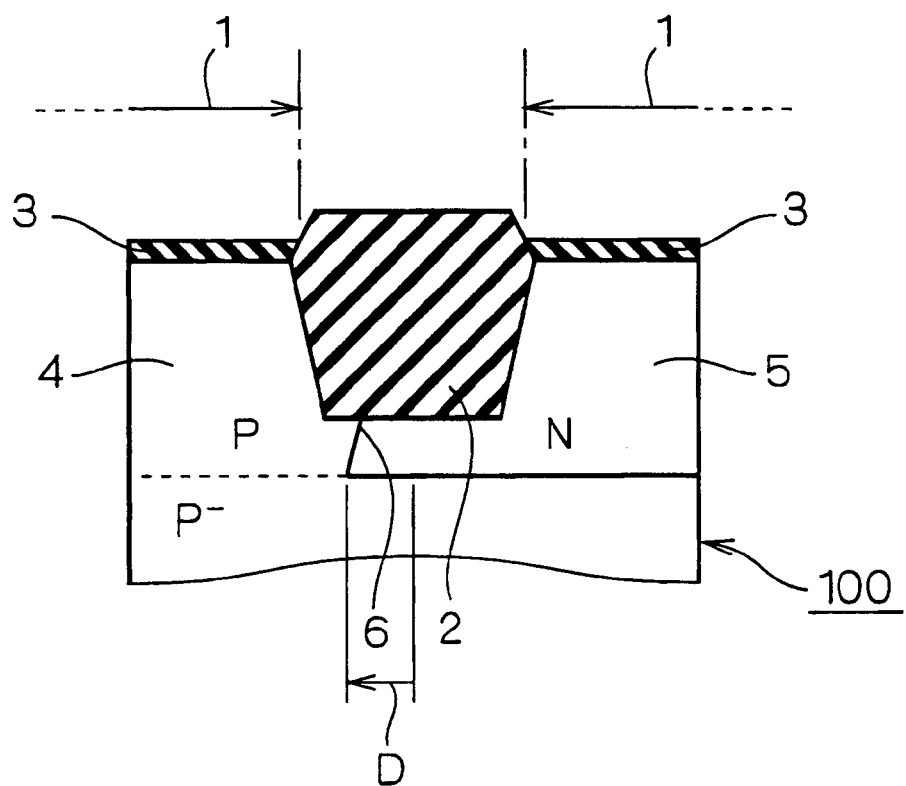

FIG. 38 presents a graph of the results of measurement. In FIG. 38, white symbols represent the result of measurement obtained with the method to be compared (FIG. 26), and black symbols represent the result of measurement obtained with the method of the eleventh preferred embodiment (FIG. 36). As seen from FIG. 38, throughout the whole range of the angle X, the method of the eleventh preferred embodiment provides a higher breakdown voltage of element isolation in both the P well 4 and N well 5, than the method to be compared. FIG. 38 indicates that the breakdown voltage of element isolation in both of the P well 4 and N well 5 can be improved even when the range $R_p$ of the P type impurity and the range $R_N$ of the N type impurity are set to the same as the thickness of the STI 2a. This also shows with sufficient accuracy that even when no implantation is performed from such plural direction that projecting components H are opposed to each other, if only the ranges $R_N$ and $R_p$ are set to the same as the thickness of the STI 2a, the breakdown voltage of element isolation can be improved to some extent, as compared to the conventional method. Further, from the foregoing results of the ninth to eleventh preferred embodiments, it is proved that if at least one of the ranges $R_N$ and $R_p$ is set to the same as the thickness of the STI 2a, the effect of improving the breakdown voltage of element isolation can be obtained to some extent.

Thus, the method of the eleventh preferred embodiment also enables to improve the breakdown voltage of element isolation. Additionally, since it is sufficient if a two-direction implantation is performed for each implantation type, the number of steps of implantation can be reduced to simplify the steps of implantation.

15. Modifications

Although the foregoing eighth to eleventh preferred embodiments describe the case that each implantation of the P and N type impurities is performed by using only one implantation type, three or more implantation types including the P and N type impurities may be used. In this case, it is most desirable that the range of each implantation type is set to be less than the thickness (i.e., depth) of the STI 2a. It is however proved from the verified data of the eighth to eleventh preferred embodiments that if only part of the implantation types, e.g., one implantation type, is set so as to have a range less than the thickness (depth) of the STI 2a, the effect of improving breakdown voltage of element isolation can be obtained to some extent.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising:

(a) obtaining a semiconductor substrate having a main surface;

(b) implanting M (M≧2) implantations of at least one impurity into said main surface through a plurality of shields disposed on said main surface, thereby to selectively form a P well and an N well adjacent each other in said main surface, wherein said M implantations are defined by separate implantations including an impurity element and an implantation energy, and for N (1≦N≦M) implants of said M implantations, said implanting implants in a plurality of directions such that projecting components of a vector indicating an implantation direction toward said main surface cancel each other; and (c) forming a semiconductor element in each of said P well and said N well.

2. The method of manufacturing a semiconductor device according to claim 1, wherein said step (b), for each of said N implants, comprises:

implanting said at least one impurity from said plurality of directions such that said projecting components cancel each other.

3. The method of manufacturing a semiconductor device according to claim 2, wherein said step (b) comprises:

implanting each of said M implantations from said plurality of directions such that said projecting components cancel each other.

4. The method of manufacturing a semiconductor device according to claim 1, wherein said step (b), for said N being 2 or more, comprises:

implanting said at least one impurity from said plurality of directions such that said projecting components cancel each other for different implantations.

5. The method of manufacturing a semiconductor device according to claim 4, wherein in said step (b), said N equals M, the conductivity type of said impurity element differs between said each different implantation, and said impurity implantation is performed from said plurality of directions such that said projecting components cancel each other between all n-type impurity implantations and all p-type impurity implantations.

6. The method of manufacturing a semiconductor device according to claim 1, wherein said step (b comprises:

implanting said at least one impurity in said plurality of directions comprising two directions selected such that said projecting components are opposed to each other on a line along said main surface.

7. The method of manufacturing a semiconductor device according to claim 1, wherein said step (b) comprises:

implanting said at least one impurity in said plurality of directions comprising four directions selected such that said projecting components are opposed to each other on two lines that cross each other at right angles along said main surface.

8. The method of manufacturing a semiconductor device according to claim 1, wherein said step (b) comprises:

implanting said at least one impurity in said plurality of directions comprising a continuously infinitesimal set of directional in which said projecting components are continuous in all directions of 360°.

9. The method of manufacturing a semiconductor device according to claim 1, further comprising:

(d) selectively forming an element isolation structure in said main surface of said semiconductor substrate, wherein in said step (b), said P well and said N well are formed such that said element isolation structure is located at a boundary between said P well and said N well, and said implanting is performed for at least one of said M implantations so as to have a range less than a thickness of said element isolation structure.

10. The method of manufacturing a semiconductor device according to claim 9, wherein said step (b) comprises:

implanting said at least one impurity for all of said M implantations so as to have a range less than said thickness of said element isolation structure.

11. A method of manufacturing a semiconductor device, comprising:

(a) obtaining a semiconductor substrate having a main surface;

(b) selectively forming an element isolation structure in said main surface of said semiconductor substrate;

(c) implanting M (M≧2) implantations of at least one impurity into said main surface through a plurality of shields disposed on said main surface, thereby to selectively form a P well and an N well adjacent each other in said main surface so that said element isolation structure is located at a boundary between said P well and said N well, wherein said M implantations are defined by separate implantations including an impurity element and an implantation energy and at least one of said M implantations implants a range less than a thickness of said element isolation structure; and (d) forming a semiconductor element in each of said P well and said N well.

12. The method of manufacturing a semiconductor device according to claim 11 wherein said step (c) comprises:

implanting all of said M implantations to a range less than said thickness of said element isolation structure.

* * * * *